United States Patent
Hosoda et al.

(10) Patent No.: US 11,041,053 B2
(45) Date of Patent: Jun. 22, 2021

(54) RESIN POWDER, METHOD FOR ITS PRODUCTION, COMPOSITE, MOLDED PRODUCT, METHOD FOR PRODUCING CERAMIC MOLDED PRODUCT, METAL LAMINATED PLATE, PRINTED CIRCUIT BOARD AND PREPREG

(71) Applicant: AGC Inc., Tokyo (JP)

(72) Inventors: Tomoya Hosoda, Chiyoda-ku (JP); Eiichi Nishi, Chiyoda-ku (JP); Toru Sasaki, Chiyoda-ku (JP); Nobutaka Kidera, Chiyoda-ku (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 16/709,049

(22) Filed: Dec. 10, 2019

(65) Prior Publication Data
US 2020/0115509 A1    Apr. 16, 2020

Related U.S. Application Data

(63) Continuation of application No. 15/414,212, filed on Jan. 24, 2017, now abandoned, which is a (Continued)

(30) Foreign Application Priority Data

Aug. 1, 2014 (JP) .................. 2014-157574
Mar. 20, 2015 (JP) .................. 2015-058672

(51) Int. Cl.
| | |
|---|---|
| C08J 3/12 | (2006.01) |
| B32B 15/08 | (2006.01) |
| B32B 27/28 | (2006.01) |
| B32B 27/30 | (2006.01) |
| C08J 5/10 | (2006.01) |

(Continued)

(52) U.S. Cl.
CPC ................. *C08J 3/12* (2013.01); *B32B 5/16* (2013.01); *B32B 7/12* (2013.01); *B32B 9/005* (2013.01); *B32B 9/041* (2013.01); *B32B 15/08* (2013.01); *B32B 15/18* (2013.01); *B32B 15/20* (2013.01); *B32B 27/08* (2013.01); *B32B 27/18* (2013.01); *B32B 27/281* (2013.01); *B32B 27/285* (2013.01); *B32B 27/30* (2013.01); *B32B 27/322* (2013.01); *B32B 27/38* (2013.01); *C08J 5/10* (2013.01); *C08J 5/24* (2013.01); *C08L 63/00* (2013.01); *C08L 79/08* (2013.01); *C08L 101/00* (2013.01); *H05K 1/0353* (2013.01); *H05K 1/0373* (2013.01); *H05K 3/0014* (2013.01); *H05K 3/06* (2013.01); *B32B 2250/44* (2013.01); *B32B 2260/021* (2013.01); *B32B 2260/046* (2013.01); *B32B 2262/0261* (2013.01); *B32B 2262/101* (2013.01); *B32B 2262/106* (2013.01); *B32B 2307/50* (2013.01); *B32B 2307/714* (2013.01); *B32B 2457/08* (2013.01); *B32B 2605/08* (2013.01); *B32B 2605/18* (2013.01); *C08F 214/26* (2013.01); *C08F 214/262* (2013.01); *C08J 2327/12* (2013.01); *C08J 2327/18* (2013.01); *C08J 2327/22* (2013.01); *C08J 2427/18* (2013.01); *H05K 2201/015* (2013.01); *H05K 2201/0209* (2013.01)

(58) Field of Classification Search
CPC ........ C08J 3/12; C08J 5/10; C08J 5/24; B32B 5/16; B32B 7/12; B32B 9/005; B32B 15/08; B32B 27/281; B32B 27/285; B32B 27/30; B32B 27/38; B32B 15/20; B32B 15/18; B32B 9/041; B32B 27/322; B32B 27/18; B32B 27/08; C08L 63/00; C08L 101/00; H05K 1/0353; H05K 3/0014; H05K 3/06; H05K 1/0373
See application file for complete search history.

(56) References Cited

U.S. PATENT DOCUMENTS

| | | | |
|---|---|---|---|
| 6,232,372 B1 | 5/2001 | Brothers et al. | |
| 6,610,788 B1 | 8/2003 | Takakura et al. | |

(Continued)

FOREIGN PATENT DOCUMENTS

| | | |
|---|---|---|
| JP | 11-80507 | 3/1999 |
| JP | 2000-128934 | 5/2000 |

(Continued)

OTHER PUBLICATIONS

International Search Report dated Oct. 27, 2015 in PCT/JP2015/071803, filed on Jul. 31, 2015.

*Primary Examiner* — John E Uselding
(74) *Attorney, Agent, or Firm* — Oblon, McClelland, Maier & Neustadt, L.L.P.

(57) ABSTRACT

A resin powder having a high bulk density and an average particle size of at most 50 μm from resin particles containing a fluorocopolymer as the main component and having a melting point of 260 to 320° C., where the fluorocopolymer contains a unit containing a carbonyl group-containing group, a unit based on tetrafluoroethylene, and a unit based on a perfluoro(alkyl vinyl ether) or a unit based on hexafluoropropylene. A method of producing the resin powder by subjecting resin particles (A) having an average particle size of at least 100 μm to mechanical pulverization treatment. The resin particles (A) is made of a material (X) having a fluorocopolymer (X1) as the main component, which has a unit (1) based on a monomer containing at least one functional group selected from a carbonyl group-containing group, a hydroxy group, an epoxy group and an isocyanate group, and a unit (2) based on tetrafluoroethylene.

6 Claims, No Drawings

Related U.S. Application Data continuation of application No. PCT/JP2015/071803, filed on Jul. 31, 2015.

(51) Int. Cl.

| | | |
|---|---|---|
| *B32B 27/38* | (2006.01) | |
| *B32B 15/20* | (2006.01) | |
| *B32B 15/18* | (2006.01) | |
| *B32B 9/00* | (2006.01) | |
| *C08L 79/08* | (2006.01) | |
| *B32B 9/04* | (2006.01) | |
| *C08L 101/00* | (2006.01) | |
| *B32B 27/32* | (2006.01) | |
| *B32B 27/18* | (2006.01) | |
| *B32B 27/08* | (2006.01) | |
| *C08L 63/00* | (2006.01) | |
| *H05K 1/03* | (2006.01) | |
| *B32B 5/16* | (2006.01) | |
| *B32B 7/12* | (2006.01) | |
| *C08J 5/24* | (2006.01) | |
| *H05K 3/00* | (2006.01) | |
| *H05K 3/06* | (2006.01) | |
| *C08F 214/26* | (2006.01) | |

(56) References Cited

U.S. PATENT DOCUMENTS

| | | |
|---|---|---|
| 2006/0093827 A1 | 5/2006 | Funaki et al. |
| 2006/0110601 A1* | 5/2006 | Hennessey ............. B05D 7/542 428/422 |
| 2010/0036053 A1* | 2/2010 | Aten ...................... C08F 214/26 524/805 |
| 2013/0065018 A1 | 3/2013 | Park et al. |
| 2015/0030857 A1* | 1/2015 | Shigenai ................. C08L 27/18 428/421 |

FOREIGN PATENT DOCUMENTS

| | | | |
|---|---|---|---|
| JP | 2002-20409 | 1/2002 | |
| JP | 2004-122794 | 4/2004 | |
| JP | 2005-142572 | 6/2005 | |
| JP | 2008-260864 | 10/2008 | |
| JP | 2009-138074 | 6/2009 | |
| JP | 2010-202741 | 9/2010 | |
| JP | 2011-225677 | 11/2011 | |
| JP | 2014-526399 | 10/2014 | |
| WO | WO-2013146078 A1 * | 10/2013 | ............. C09D 5/033 |

\* cited by examiner

RESIN POWDER, METHOD FOR ITS PRODUCTION, COMPOSITE, MOLDED PRODUCT, METHOD FOR PRODUCING CERAMIC MOLDED PRODUCT, METAL LAMINATED PLATE, PRINTED CIRCUIT BOARD AND PREPREG

CROSS REFERENCE TO RELATED APPLICATIONS

This application is a continuation of U.S. application Ser. No. 15/414,212, filed on Jan. 24, 2017, which is a continuation of PCT/JP2015/071803, filed on Jul. 31, 2015, which is incorporated herein by reference, and claims foreign priority to JP 2015-058672, filed on Mar. 20, 2015, and JP 2014-157574, filed on Aug. 1, 2014, the entire contents of which are incorporated herein by reference.

TECHNICAL FIELD

The present invention relates to a resin powder, a method for its production, a composite, a molded product, a method for producing a ceramic molded product, a metal laminated plate, a printed circuit board and a prepreg.

BACKGROUND ART

In recent years, along with weight reduction, size reduction and high densification of electronic products, demand for various types of printed circuit boards has been expanded. As a printed circuit board, for example, one obtained by laminating a metal foil on a substrate made of an insulating material such as polyimide and forming a circuit by patterning the metal foil, is used.

Recently, for the printed circuit board, excellent electrical characteristics (low relative dielectric constant, etc.) corresponding to the frequency in a high frequency band, excellent heat resistance to withstand soldering work, etc. are required. Among them, improvement in electrical characteristics has been demanded.

As a material having a low relative dielectric constant and useful for printed circuit boards, a composite has been proposed, which is obtained by filling a fluoropolymer fine powder having an average particle size in a range of from 0.02 to 5 μm in a polyimide (Patent Document 1).

In Patent Document 1, a commercially available powder of polytetrafluoroethylene (hereinafter referred to also as "PTFE") is pulverized by a hammer mill to prepare the fluoropolymer fine powder.

PRIOR ART DOCUMENT

Patent Document

Patent Document 1: JP-A-2005-142572

DISCLOSURE OF INVENTION

Technical Problem

The present inventors have found that if it is attempted to pulverize particles composed mainly of a tetrafluoroethylene/perfluoro(alkyl vinyl ether) copolymer (hereinafter referred to also as "PFA") by a hammer mill, to obtain a powder having an average particle size of at most 50 μm, there is a problem that the bulk density decreases. Further, as a result of a further study, it has been found that there is a problem similar to above, also with respect to particles composed mainly of a fluorocopolymer having a melting point of from 260 to 320° C. other than PFA. For a powder having a small bulk density with an average particle size of at most 50 μm, it is necessary to provide an extra storage space when it comes to industrial handling for combining it with other materials.

It is an object of the present invention to provide a production method capable of producing a resin powder having a large bulk density with an average particle size of at most 50 μm by mechanical pulverization from resin particles containing a fluorocopolymer with a melting point of from 260 to 320° C. as the main component, such as PFA; a resin powder obtainable by the production method; a composite using the same; a molded product; a method for producing a ceramic molded product; a metal laminated plate; a printed circuit board; and a prepreg.

Solution to Problem

The present inventors have made intensive studies and, as a result, have found that in a case where PFA having a unit containing a specific functional group introduced is used, as PFA, there is a tendency that as compared with the case of using common PFA having no such unit introduced, the average particle size of the pulverized product obtained by conducting mechanical pulverization under the same conditions is small and the bulk density is large. Further, it has been found that there is the same tendency as above, also with respect to a fluorocopolymer having a melting point of from 260 to 320° C. other than PFA, when one having a unit containing a specific functional group introduced, is used. Based on these findings, the present invention has been accomplished.

The present invention has the following aspects.

(1) A method for obtaining a resin powder having an average particle size of from 0.02 to 50 μm, which comprises subjecting resin particles (A) having an average particle size of at least 100 μm to mechanical pulverization treatment, and which is characterized in that the resin particles (A) are made of a material (X) containing the following fluorocopolymer (X1) as the main component:

Fluorocopolymer (X1): a fluorocopolymer which has a unit (1) containing at least one type of functional group selected from the group consisting of a carbonyl group-containing group, a hydroxy group, an epoxy group and an isocyanate group, and a unit (2) based on tetrafluoroethylene, and which has a melting point of from 260 to 320° C.

(2) The method for obtaining a resin powder according to the above (1), wherein the fluorocopolymer (X1) is the following fluorocopolymer (X1-1):

Fluorocopolymer (X1-1): a fluorocopolymer which has the unit (1), the unit (2) and a unit (3-1) based on a perfluoro(alkyl vinyl ether), wherein to the total of all units, the proportion of the unit (1) is from 0.01 to 3 mol %, the proportion of the unit (2) is from 90 to 99.89 mol %, and the proportion of the unit (3-1) is from 0.1 to 9.99 mol %, and which has a melting point of from 260 to 320° C.

(3) The method for obtaining a resin powder according to the above (1), wherein the fluorocopolymer (X1) is the following fluorocopolymer (X1-2):

Fluorocopolymer (X1-2): a fluorocopolymer which has the unit (1), the unit (2) and a unit (3-2) based on hexafluoropropylene, wherein to the total of all units, the proportion of the unit (1) is from 0.01 to 3 mol %, the proportion of the unit (2) is from 90 to 99.89 mol %, and the proportion of the unit (3-2) is from 0.1 to 9.99 mol %, and which has a melting point of from 260 to 320° C.

(4) The method for obtaining a resin powder according to any one of the above (1) to (3), wherein the unit (1) includes a unit containing a carbonyl group-containing group, and said carbonyl group-containing group is at least one member selected from the group consisting of a group having a carbonyl group between carbon atoms in a hydrocarbon group, a carbonate group, a carboxy group, a haloformyl group, an alkoxy carbonyl group and an acid anhydride residue group.

(5) The method for obtaining a resin powder according to any one of the above (1) to (4), wherein the average particle size of the resin powder is from 0.02 to 10 μm.

(6) The method for obtaining a resin powder according to any one of the above (1) to (5), wherein the average particle size of the resin powder is from 0.02 to 6 μm, and D90 is at most 8 μm.

(7) The method for obtaining a resin powder according to any one of the above (1) to (6), wherein the mechanical pulverization treatment is conducted after cooling the resin particles (A) to a temperature of at most −40° C., or conducted by using a jet mill.

(8) The method for obtaining a resin powder according to the above (7), wherein the mechanical pulverization treatment is conducted by using a jet mill.

(9) A method for producing a composite, which comprises producing a resin powder by the method for obtaining a resin powder as defined in any one of the above (1) to (6), and dispersing the obtained resin powder in a resin (C) (but excluding the fluorocopolymer (X1)).

(10) The method for producing a composite according to the above (9), wherein the resin (C) is a thermosetting resin or a photosensitive resin.

(11) The method for producing a composite according to the above (10), wherein the resin (C) is a thermosetting resin, and the thermosetting resin comprises at least one member selected from the group consisting of a polyimide and an epoxy resin.

(12) The method for producing a composite according to the above (11), wherein the relative dielectric constant (value measured at a frequency of 2.5 GHz in an environment within a range of 23° C.±2° C. and RH of 50±5%) is from 2.0 to 3.5.

(13) The method for producing a composite according to any one of the above (9) to (12), which is used to form at least one of an interlayer insulating film of a printed circuit board, a coverlay film and a solder resist.

(14) A method for producing a molded product, which comprises producing a composite by the method for producing a composite as defined in any one of the above (9) to (12), and molding the obtained composite.

(15) A method for producing a ceramic molded product, which comprises steps of producing a resin powder by the production method as defined in any one of the above (1) to (6), mixing the obtained resin powder and a ceramic powder to obtain a mixture, and molding the mixture to obtain a ceramic molded product.

(16) A method for producing a metal laminated plate, which comprises producing a molded product by the production method as defined in the above (14), and laminating a metal layer on one side or both sides of a substrate made of the obtained molded product.

(17) A method for producing a printed circuit board, which comprises producing a metal laminated plate by the production method as defined in the above (16), and etching the metal layer of the obtained metal laminated plate to form a patterned circuit.

(18) A method for producing a prepreg, which comprises producing a resin powder by the production method as defined in any one of the above (1) to (6), and impregnating at least one member selected from the group consisting of a thermosetting resin composition containing the obtained resin powder and a thermoplastic resin composition containing the obtained resin powder, in a fiber substrate.

(19) A method for producing an adhesive film, which comprises laminating a layer made of the composite obtained by the production method as defined in the above (9) on at least one side of a heat-resistant resin film, wherein the resin powder has an average particle size of from 0.02 to 6 μm and D90 of at most 8 μm, and the relative dielectric constant (value measured at a frequency of 2.5 GHz in an environment within a range of 23° C.±2° C. and RH of 50±5%) of the adhesive layer is from 2.0 to 3.5.

(20) A method of producing a metal laminated plate, which comprises laminating a metal layer on at least one layer made of the layer of the composite of the adhesive film obtained by the production method as defined in the above (19).

(21) An adhesive film in which a layer made of a composite having a resin powder made of a material (X) containing a fluorocopolymer (X1) as the main component dispersed in a resin (C) (but excluding the fluorocopolymer (X1)), is laminated on at least one side of a heat-resistant resin film, wherein
the fluorocopolymer (X1) has a unit (1) containing at least one type of functional group selected from the group consisting of a carbonyl group-containing group, a hydroxy group, an epoxy group and an isocyanate group, and a unit (2) based on tetrafluoroethylene, and has a melting point of from 260 to 320° C.; the resin powder has an average particle size of from 0.02 to 6 μm and D90 of at most 8 μm; and the relative dielectric constant (value measured at a frequency of 2.5 GHz in an environment within a range of 23° C.±2° C. and RH of 50±5%) of the adhesive film is from 2.0 to 3.5.

(22) A metal laminated plate having a metal layer directly laminated on at least one layer made of the layer of the composite of the adhesive film as defined in the above (21).

(23) A composite to be used for forming at least one member selected from the group consisting of an interlayer insulating film of a printed circuit board, a coverlay film and a solder resist,
said composite being a composite in which a resin powder made of a material (X) containing a fluorocopolymer (X1) as the main component is dispersed in a resin (C) (but excluding the fluorocopolymer (X1)), wherein the fluorocopolymer (X1) has a unit (1) containing at least one type of functional group selected from the group consisting of a carbonyl group-containing group, a hydroxy group, an epoxy group and an isocyanate group, and a unit (2) based on tetrafluoroethylene, and has a melting point of from 260 to 320° C.; the resin powder has an average particle size of from 0.02 to 6 μm and D90 of at most 8 μm; and the relative dielectric constant (value measured at a frequency of 2.5 GHz in an environment within a range of 23° C.±2° C. and RH of 50±5%) of the composite is from 2.0 to 3.5.

(24) A prepreg in which at least one member selected from the group consisting of a thermosetting resin composition containing a resin powder, and a thermoplastic resin composition containing a resin powder, is impregnated in a fiber substrate, wherein said at least one member selected from the group consisting of the thermosetting resin composition and the thermoplastic resin composition, is a composite in which a resin powder made of a material (X) containing a fluorocopolymer (X1) as the main component is dispersed in a resin (C) (but excluding the fluorocopolymer (X1)); the fluorocopolymer (X1) has a unit (1) containing at least one type of functional group selected from the group consisting of a carbonyl group-containing group, a hydroxy group, an epoxy group and an isocyanate group, and a unit (2) based on tetrafluoroethylene, and has a melting point of from 260 to 320° C.; the resin powder has an average particle size of from 0.02 to 6 μm and D90 of at most 8 μm; and the relative dielectric constant (value measured at a frequency of 2.5 GHz in an environment within a range of 23° C.±2° C. and RH of 50±5%) of the thermosetting resin composition and/or the thermoplastic resin composition is from 2.0 to 3.5.

(25) A metal laminated plate having a metal layer laminated on one side or both sides of the prepreg as defined in the above (24).

Advantageous Effects of Invention

According to the present invention, it is possible to provide a method for producing a resin powder having a large bulk density and an average particle size of at most 50 μm by mechanical pulverization from resin particles containing a fluorocopolymer having a melting point of from 260 to 320° C., such as PFA; a resin powder obtainable by the production method; a composite using the same; a molded product; a method for producing a ceramic molded product; a metal laminated plate; a printed circuit board; and a prepreg.

DESCRIPTION OF EMBODIMENTS

The following definitions of terms apply throughout the specification including claims.

A "relative dielectric constant" is a value measured at a frequency of 2.5 GHz in an environment within a range of 23° C.±2° C. and RH of 50±5% by the SPDR (split post dielectric resonator) method.

A "unit" represents a unit derived from a monomer, as formed by polymerization of the monomer. A unit may be a unit formed directly by a polymerization reaction or may be a unit having part of a unit in a polymer obtained by a polymerization reaction converted to another structure by treating the polymer.

A "monomer" is a compound having a polymerizable unsaturated bond such as a polymerizable carbon-carbon double bond.

A "carbonyl group-containing group" is a group containing a carbonyl group (—C(=O)—) in its structure.

An "etheric oxygen atom" is one oxygen atom present between carbon-carbon atoms (—C—O—C—).

A "perfluoroalkyl group" is a group having all hydrogen atoms in an alkyl group substituted by fluorine atoms. A "perfluoroalkylene group" is a group having all hydrogen atoms in an alkylene group substituted by fluorine atoms.

A "(meth)acrylate" means an acrylate or a methacrylate.

«Method for Producing Resin Powder»

In the method for producing a resin powder of the present invention, via a step of applying a mechanical pulverization treatment (hereinafter referred to also as "pulverization step") to resin particles (A) having an average particle size of at least 100 μm, a resin powder having an average particle size of from 0.02 to 50 μm (hereinafter referred to also as "resin powder (B)") is obtained.

The production method of the present invention may contain, after the pulverization step, a step of classifying the pulverized product obtained in the pulverization step (hereinafter referred to also as "classification step").

The resin particles (A) are made of a material (X).

<Material (X)>

The material (X) contains a fluorocopolymer (X1) as the main component.

The material (X) "contains a fluorocopolymer (X1) as the main component" means that the proportion of the fluorocopolymer (X1) to the total amount (100 mass %) of the material (X) is at least 80 mass %. The proportion of the fluorocopolymer (X1) to the total amount (100 mass %) of the material (X) is preferably at least 85 mass %, more preferably at least 90 mass %, particularly preferably 100 mass %. When the fluorocopolymer (X1) is the main component, it is possible to obtain one having a large bulk density as the resin powder (B). The larger the bulk density of the resin powder (B), the better the handling efficiency.

The fluorocopolymer (X1) to be contained in the material (X) may be of one type, or two or more types in combination.

The material (X) may further contain another resin (X2) other than the fluorocopolymer (X1), as the case requires, within a range not to impair the effects of the present invention.

[Fluorocopolymer (X1)]

The fluorocopolymer (X1) has the following unit (1) and the following unit (2). As the case requires, it may further have other units in addition to the unit (1) and the unit (2).

The unit (1) is a unit containing at least one type of functional group selected from the group consisting of a carbonyl group-containing group, a hydroxy group, an epoxy group and an isocyanate group (hereinafter referred to also as "functional group (i)").

The carbonyl group-containing group is not particularly limited so long as it is a group containing a carbonyl group in its structure, and, for example, a group having a carbonyl group between carbon atoms in a hydrocarbon group, a carbonate group, a carboxy group, a haloformyl group, an alkoxycarbonyl group, an acid anhydride residue group, a polyfluoroalkoxycarbonyl group, a fatty acid residue group, etc. may be mentioned.

Among them, from the viewpoint of improvement of mechanical pulverization and improvement of adhesion to a metal, at least one member selected from the group consisting of a group having a carbonyl group between carbon atoms in a hydrocarbon group, a carbonate group, a carboxy group, a haloformyl group, an alkoxycarbonyl group and an acid anhydride residue group, is preferred, and one or both of a carboxy group and an acid anhydride residue group are more preferred.

In the above group having a carbonyl group between carbon atoms in a hydrocarbon group, the hydrocarbon group may, for example, be an alkylene group having from 2 to 8 carbon atoms. The number of carbon atoms in the alkylene group is the number of carbon atoms in a state not containing the carbonyl group. The alkylene group may be linear or branched.

The haloformyl group is represented by —C(=O)—X (where X is a halogen atom). As the halogen atom in the haloformyl group, a fluorine atom or a chlorine atom may, for example, be mentioned, and a fluorine atom is preferred. That is, as the haloformyl group, a fluoroformyl group (referred to also as a carbonyl fluoride group) is preferred.

The alkoxy group in the alkoxycarbonyl group may be linear or branched, and is preferably an alkoxy group having from 1 to 8 carbon atoms, particularly preferably a methoxy group or an ethoxy group.

As the unit (1), a unit based on a monomer (hereinafter referred to also as "monomer (m1)") containing a functional group (i) is preferred.

The functional group (i) in the monomer (m1) may be one, or two or more. When the monomer has two or more functional groups (i), such two or more functional groups (i) may be respectively the same or different.

As the monomer (m1), a compound having one functional group (i) and having one polymerizable double bond, is preferred.

Among the monomers (m1), as the monomer containing a carbonyl group-containing group, for example, a cyclic hydrocarbon compound (hereinafter referred to also as "monomer (m11)") having an acid anhydride residue group and a polymerizable unsaturated bond, a monomer (hereinafter referred to also as "monomer (m12)") having a carboxy group, a vinyl ester, a (meth)acrylate, $CF_2=CFOR^{f1}CO_2X^1$ (wherein $R^{f1}$ is a $C_{1-10}$ perfluoroalkylene group which may have an etheric oxygen atom, and $X^1$ is a hydrogen atom or an alkyl group having from 1 to 3 carbon atoms), or the like, may be mentioned.

The monomer (m11) may, for example, be an acid anhydride of an unsaturated dicarboxylic acid. The acid anhydride of an unsaturated dicarboxylic acid may, for example, be itaconic anhydride (hereinafter referred to also as "IAH"), citraconic anhydride (hereinafter referred to also as "CAH"), 5-norbornene-2,3-dicarboxylic acid anhydride (another name: anhydrous high mix acid, hereinafter referred to also as "NAH"), maleic anhydride, etc.

The monomer (m12) may, for example, be an unsaturated dicarboxylic acid such as itaconic acid, citraconic acid, 5-norbornene-2,3-dicarboxylic acid, maleic acid, etc.; an unsaturated monocarboxylic acid such as acrylic acid, methacrylic acid, etc.; etc.

The vinyl ester may, for example, be vinyl acetate, vinyl chloroacetate, vinyl butanoate, vinyl pivalate, vinyl benzoate, vinyl crotonate, etc.

The (meth)acrylate may, for example, be a (polyfluoroalkyl) acrylate, a (polyfluoroalkyl) methacrylate, etc.

The monomer containing a hydroxy group may, for example, be a vinyl ester, a vinyl ether, an allyl ether or a (meth)acrylate compound, and one having one or more hydroxy groups at its terminal or in its side chain, a crotonic acid-modified compound such as hydroxyethyl crotonate, or allyl alcohol, may, for example, be mentioned.

The monomer containing an epoxy group may, for example, be an unsaturated glycidyl ether (e.g. allyl glycidyl ether, 2-methyl allyl glycidyl ether, vinyl glycidyl ether, etc.), an unsaturated glycidyl ester (e.g. glycidyl acrylate, glycidyl methacrylate, etc.), etc.

The monomer containing an isocyanate group may, for example, be an unsaturated monomer having an isocyanate group, such as 2-(meth)acryloyloxyethyl isocyanate, 2-(2-(meth)acryloyloxyethoxy)ethyl isocyanate, 1,1-bis((meth)acryloyloxymethyl)ethyl isocyanate, etc.

As the monomer (m1), one type may be used alone, or two or more types may be used in combination.

From the viewpoint of improvement of mechanical pulverization properties and improvement of adhesion with a metal, it is preferred that the unit (1) has at least a carbonyl group-containing group as a functional group (i). Therefore, the monomer (m1) preferably includes a monomer containing a carbonyl group-containing group.

As the monomer containing a carbonyl group-containing group, from the viewpoint of the thermal stability and improvement of the adhesion to a metal, the monomer (m11) is preferred. Among them, at least one member selected from the group consisting of IAH, CAH and NAH is particularly preferred. When at least one member selected from the group consisting of IAH, CAH and NAH is used, it is possible to easily produce a fluorocopolymer having an acid anhydride residue group, without necessity of using a special polymerization method (see JP-A-11-193312) which is required when maleic anhydride is used.

Among IAH, CAH and NAH, NAH is preferred, since the adhesion between the resin powder (B) and another resin (C) (such as a polyimide) forming the composite will be thereby more excellent.

The unit (2) is a unit based on tetrafluoroethylene (hereinafter referred to also as "TFE").

Other units other than the unit (1) and the unit (2) may, for example, be a unit (3-1), a unit (3-2), a unit (4), etc.

As the fluorocopolymer (X1), for example, a tetrafluoroethylene/perfluoro(alkyl vinyl ether) copolymer (PFA), a tetrafluoroethylene/hexafluoropropylene copolymer (FEP), and their modified products, may be mentioned.

As the fluorocopolymer (X1), the following fluorocopolymer (X1-1) or fluorocopolymer (X1-2) is preferred, and the fluorocopolymer (X1-1) is particularly preferred (Fluorocopolymer (X1-1))

The fluorocopolymer (X1-1) has the unit (1), the unit (2) and the following unit (3-1). As the case requires, it may further have the following unit (3-2) and/or unit (4).

The unit (3-1) is a unit based on a perfluoro(alkyl vinyl ether) (hereinafter referred to also as "PAVE").

PAVE may, for example, be $CF_2=CFOR^{f2}$ (wherein R is a $C_{1-10}$ perfluoroalkyl group which may contain an etheric oxygen atom).

The perfluoroalkyl group for R may be linear or branched. The number of carbon atoms in R is preferably from 1 to 3. $CF_2=CFOR^{f2}$ may, for example, be $CF_2=CFOCF_3$, $CF_2=CFOCF_2CF_3$, $CF_2=CFOCF_2CF_2CF_3$, $CF_2=CFOCF_2CF_2CF_2CF_3$, $CF_2=CFO(CF_2)_8F$, etc., and $CF_2=CFOCF_2CF_2CF_3$ (hereinafter referred to also as "PPVE") is preferred.

As PAVE, one type may be used alone, or two or more types may be used in combination.

The unit (3-2) is a unit based on hexafluoropropylene (hereinafter referred to also as "HFP").

The unit (4) is a unit other than the units (1), (2), (3-1) and (3-2) and may, for example, be a unit based on a monomer other than the monomer (m1), TFE, PAVE and HFP.

Such other monomer may, for example, be a fluorinated monomer (but excluding the monomer (m1), TFE, PAVE and HFP) (hereinafter referred to also as "monomer (m41)"), a non-fluorinated monomer (but excluding the monomer (m1)) (hereinafter referred to also as "monomer (m42)"), etc.

As the monomer (m41), a fluorinated compound having one polymerizable double bond is preferred, and, for example, a fluoroolefin (but excluding TFE and HFP) such as vinyl fluoride, vinylidene fluoride (hereinafter referred to also as "VdF"), trifluoroethylene, chlorotrifluoroethylene (hereinafter referred to also as "CTFE"), etc., $CF_2=CFOR^{f3}SO_2X^3$ (wherein $R^{f3}$ is a $C_{1-10}$ perfluoroalkylene group, or a $C_{2-10}$ perfluoroalkylene group containing an etheric oxygen atom, and $X^3$ is a halogen atom or a hydroxy group), $CF_2=CF(CF_2)_pOCF=CF_2$ (wherein p is 1 or 2), $CH_2=CX^4(CF_2)_qX^5$ (wherein $X^4$ is a hydrogen atom or a fluorine atom, q is an integer of from 2 to 10, and $X^5$ is a hydrogen atom or a fluorine atom), perfluoro(2-methylene-4-methyl-1,3-dioxolane), etc., may be mentioned. One of these may be used alone, or two or more of them may be used in combination.

As the monomer (m41), at least one member selected from the group consisting of VdF, CTFE and $CH_2=CX^4(CF_2)_qX^5$ is preferred.

$CH_2=CX^4(CF_2)_qX^5$ may, for example, be $CH_2=CH(CF_2)_2F$, $CH_2=CH(CF_2)_3F$, $CH_2=CH(CF_2)_4F$, $CH_2=CF(CF_2)_3H$, $CH_2=CF(CF_2)_4H$, etc., and $CH_2=CH(CF_2)_4F$ or $CH_2=CH(CF_2)_2F$ is preferred.

As the monomer (m42), a non-fluorinated compound having one polymerizable double bond is preferred, and, for example, an olefin having at most 3 carbon atoms, such as ethylene or propylene, may be mentioned. One of them may be used alone, or two or more of them may be used in combination.

As the monomer (m42), ethylene or propylene is preferred, and ethylene is particularly preferred.

As other monomers, one type may be used alone, or two or more types may be used in combination. When two or more types are used in combination, two or more monomers (m41) may be used in combination, or two or more monomers (m42) may be used in combination, or at least one monomer (m41) and at least one monomer (m42) may be used in combination.

The fluorocopolymer (X1-1) may be one composed of the unit (1), the unit (2) and the unit (3-1), or one composed of the unit (1), the unit (2), the unit (3-1) and the unit (3-2), or one composed of the unit (1), the unit (2), the unit (3-1) and the unit (4), or one composed of the unit (1), the unit (2), the unit (3-1), the unit (3-2) and the unit (4).

As the fluorocopolymer (X1-1), preferred is a copolymer having the unit based on a monomer containing a carbonyl group-containing group, the unit (2) and the unit (3-1), and particularly preferred is a copolymer having the unit based on the monomer (m11), the unit (2) and the unit (3-1).

Specific preferred examples of the fluorocopolymer (X1-1) may, for example, be a TFE/PPVE/NAH copolymer, a TFE/PPVE/IAH copolymer, a TFE/PPVE/CAH copolymer, etc.

The fluorocopolymer (X1-1) may have a functional group (i) as a main chain terminal group. As the functional group (i) as a main chain terminal group, an alkoxycarbonyl group, a carbonate group, a carboxy group, a fluoroformyl group, an acid anhydride residue group, a hydroxy group, etc. are preferred. Such a functional group may be introduced by suitably selecting a radical polymerization initiator, a chain transfer agent or the like to be used at the time of producing the fluorocopolymer (X1-1).

Composition:

The proportion of the unit (1) to the total (100 mol %) of all units constituting the fluorocopolymer (X1-1) is from 0.01 to 3 mol %, preferably from 0.03 to 2 mol %, particularly preferably from 0.05 to 1 mol %. When the content of the unit (1) is at least the lower limit value in the above range, the bulk density of the resin powder (B) obtainable by mechanical pulverization of the resin particles (A) tends to be large as compared with a case where resin particles with the same average particle size containing PFA as the main component, other than the fluorocopolymer (X1-1), are pulverized under the same conditions. Further, adhesion between the resin powder (B) and another resin to form a composite (C), and interlayer adhesion of a laminate (such as a metal laminated plate) obtainable by laminating said composite with another material (such as a metal), will be good. When the content of the unit (1) is at most the upper limit value in the above range, heat resistance, color, etc. of the fluorocopolymer (X1-1) will be good.

The proportion of the unit (2) to the total of all units constituting the fluorocopolymer (X1-1) is from 90 to 99.89 mol %, preferably from 95 to 99.47 mol %, particularly preferably from 96 to 98.95 mol %. When the content of the unit (2) is at least the lower limit value in the above range, the fluorocopolymer (X1-1) will be excellent in electrical characteristics (low relative dielectric constant, etc.), heat resistance, chemical resistance, etc. When the content of the unit (2) is at most the upper limit value in the above range, the fluorocopolymer (X1-1) will be excellent in melt moldability, stress cracking resistance, etc.

The proportion of the unit (3-1) to the total of all units constituting the fluorocopolymer (X1-1) is from 0.1 to 9.99 mol %, preferably from 0.5 to 9.97 mol %, particularly preferably from 1 to 9.95 mol %. When the content of the unit (3-1) is within the above range, the fluorocopolymer (X1-1) will be excellent in moldability.

The total proportion of the units (1), (2) and (3-1) to the total of all units in the fluorocopolymer (X1-1) is preferably at least 90 mol %, more preferably at least 95 mol %, further preferably at least 98 mol %. The upper limit of such a total proportion is not particularly limited and may be 100 mol %.

The content of each unit in the fluorocopolymer (X1-1) can be measured by a NMR analysis such as a molten nuclear magnetic resonance (NMR) analysis, a fluorine content analysis, an infrared absorption spectrum analysis, etc. For example, it is possible to obtain the proportion (mol %) of the unit (1) in all units constituting the fluorocopolymer (X1-1), by using a method such as an infrared absorption spectrum analysis, as described in JP-A-2007-314720.

(Fluorocopolymer (X1-2))

The fluorocopolymer (X1-2) has the unit (1), the unit (2) and the unit (3-2). As the case requires, it may further contain the unit (3-1) and/or the unit (4).

The fluorocopolymer (X1-2) may be one composed of the unit (1), the unit (2) and the unit (3-2), or one composed of the unit (1), the unit (2), the unit (3-2) and the unit (3-1), or one composed of the unit (1), the unit (2), the unit (3-2) and the unit (4), or one composed of the unit (1), the unit (2), the unit (3-2), the unit (3-1) and the unit (4).

As the fluorocopolymer (X1-2), preferred is a copolymer having the unit based on the monomer containing a carbonyl group-containing group, the unit (2) and the unit (3-2), and particularly preferred is a copolymer having the unit based on the monomer (m11), the unit (2) and the unit (3-2).

Specific preferred examples of the fluorocopolymer (X1-2) may, for example, be a TFE/HFP/NAH copolymer, a TFE/HFP/IAH copolymer, a TFE/HFP/CAH copolymer, etc.

The fluorocopolymer (X1-2) may have a functional group (i) as a main chain terminal group. The functional group (i) may be the same as described above.

Composition:

The proportion of the unit (1) to the total (100 mol %) of all units constituting the fluorocopolymer (X1-2) is from 0.01 to 3 mol %, preferably from 0.02 to 2 mol %, particularly preferably from 0.05 to 1.5 mol %. When the content of the unit (1) is at least the lower limit value in the above range, the bulk density of the resin powder (B) obtainable by mechanical pulverization of the resin particles (A), tends to be large as compared with a case where resin particles with the same average particle size containing FEP as the main component, other than the fluorocopolymer (X1-2), are pulverized under the same conditions. Further, adhesion between the resin powder (B) and another resin to form the composite (C), and interlayer adhesion of a laminate (such as a metal laminated plate) obtained by laminating said composite with another material (such as a metal), will be good. When the content of the unit (1) is at most the upper limit value in the above range, heat resistance, color, etc. of the fluorocopolymer (X1-2) will be good.

The proportion of the unit (2) to the total of all units constituting the fluorocopolymer (X1-2) is from 90 to 99.89 mol %, preferably from 91 to 98 mol %, particularly preferably from 92 to 96 mol %. When the content of the unit (2) is at least the lower limit value in the above range, the fluorocopolymer (X1-2) will be excellent in electrical characteristics (low relative dielectric constant, etc.), heat resistance, chemical resistance, etc. When the content of the unit (2) is at most the upper limit value in the above range, the fluorocopolymer (X1-2) will be excellent in melt moldability, stress cracking resistance, etc.

The proportion of the unit (3-2) to the total of all units constituting the fluorocopolymer (X1-2) is from 0.1 to 9.99 mol %, preferably from 1 to 9 mol %, particularly preferably from 2 to 8 mol %. When the content of the unit (3-2) is within the above range, the fluorocopolymer (X1-2) will be excellent in moldability.

The total proportion of the units (1), (2) and (3-2) to the total of all units in the fluorocopolymer (X1-2) is preferably at least 90 mol %, at least 95 mol %, further preferably at least 98 mol %. The upper limit for such a total proportion is not particularly limited and may be 100 mol %.

The melting point of the fluorocopolymer (X1) is from 260 to 320° C., preferably from 280 to 320° C., more preferably from 295 to 315° C., particularly preferably from 295 to 310° C. When the melting point of the fluorocopolymer (X1) is at least the lower limit value in the above range, the heat resistance will be excellent, and when it is at most the upper limit value in the above range, the melt moldability will be excellent.

The melting point of the fluorocopolymer (X1) can be adjusted by the types and contents of units constituting the fluorocopolymer (X1), the molecular weight, etc. For example, as the proportion of the unit (2) increases, the melting point tends to rise.

In the fluorocopolymer (X1), the melt flow rate (hereinafter referred to as "MFR") at a temperature higher by at least 20° C. than the melting point of the fluorocopolymer (X1) (usually, 372° C. is adopted), is preferably from 0.1 to 1,000 g/10 min, more preferably from 0.5 to 100 g/10 min, further preferably from 1 to 30 g/10 min, particularly preferably from 5 to 20 g/10 min.

When MFR is at least the lower limit value in the above range, the fluorocopolymer (X1) will be excellent in moldability, and a molded product formed from a composite containing the resin powder (B) will be excellent in surface smoothness and appearance. When MFR is at most the upper limit value in the above range, the fluorocopolymer (X1) will be excellent in mechanical strength, and a molded product formed from a composite containing the resin powder (B) will be excellent in mechanical strength.

MFR is an index for the molecular weight of the fluoroopolymer (X1), and MFR being large indicates that the molecular weight is small, and MFR being small indicates that the molecular weight is large.

The molecular weight of the fluorocopolymer (X1), and thus MFR, can be adjusted by the conditions for producing the fluorocopolymer (X1). For example, if the polymerization time is shortened in the polymerization of the monomer, MFR tends to increase.

The relative dielectric constant of the fluorocopolymer (X1) is preferably at most 2.5, particularly preferably at most 2.4. Usually, the relative dielectric constant is from 2.0 to 2.4. The lower the relative dielectric constant of the fluorocopolymer (X1), the better the electrical characteristics of a molded product formed from a composite containing the resin powder (B). For example, excellent transmission efficiency is obtainable when the molded product is used as a substrate for a printed circuit board.

The relative dielectric constant of the fluorocopolymer (X1) can be adjusted by the content of the unit (2).

(Method for Producing Fluorocopolymer (X1))

The fluorocopolymer (X1) may be produced by a conventional method.

As a method for producing the fluorocopolymer (X1), for example, (a) a method of polymerizing the monomer (m1) and TFE, and, as the case requires, other monomers (PAVE, FEP, other than those, etc.), may be mentioned.

The polymerization method is not particularly limited, but, for example, a polymerization method using a radical polymerization initiator is preferred.

As such a polymerization method, bulk polymerization, solution polymerization using an organic solvent such as a fluorinated hydrocarbon, a chlorinated hydrocarbon, a fluorinated chlorinated hydrocarbon, an alcohol or a hydrocarbon, suspension polymerization using an aqueous medium and, as the case requires, a suitable organic solvent, emulsion polymerization using an aqueous medium and an emulsifier, etc. may be mentioned, and among them, solution polymerization is preferred.

As the radical polymerization initiator, preferred is an initiator having a temperature of from 0 to 100° C. at which its half-life is 10 hours, and more preferred is an initiator having such a half-life temperature of from 20 to 90° C.

Specific examples include an azo compound such as azobisisobutyronitrile, a non-fluorinated diacyl peroxide, such as isobutyryl peroxide, octanoyl peroxide, benzoyl peroxide, lauroyl peroxide, etc., a peroxydicarbonate such as diisopropyl peroxydicarbonate, a peroxy ester, such as tert-butyl peroxypivalate, tert-butyl peroxyisobutyrate, tert-butyl peroxy acetate, etc., a fluorinated diacyl peroxide such as a compound represented by $(Z-(CF_2)_rCOO)_2$ (wherein Z is a hydrogen atom, a fluorine atom or a chlorine atom, and r is an integer of from 1 to 10), an inorganic peroxide, such as potassium persulfate, sodium persulfate, ammonium persulfate, etc.

At the time of the polymerization, it is also preferred to use a chain transfer agent in order to control the molecular weight and melt viscosity of the fluorocopolymer (X1).

The chain transfer agent may, for example, be an alcohol such as methanol, ethanol, etc., a chlorofluorohydrocarbon such as 1,3-dichloro-1,1,2,2,3-pentafluoropropane, 1,1-dichloro-1-fluoroethane, etc., a hydrocarbon such as pentane, hexane, cyclohexane, etc., acetic acid, an acetic acid derivative such as acetic anhydride, a glycol such as ethylene glycol, propylene glycol, etc.

As at least one of a radical polymerization initiator and a chain transfer agent, a compound having a functional group (i) may be used. It is thereby possible to introduce the functional group (i) to a main chain terminal of a fluorocopolymer (X1) to be produced.

As such a radical polymerization initiator, di-n-propyl peroxydicarbonate, diisopropyl peroxycarbonate, t-butylperoxyisopropyl carbonate, bis(4-t-butylcyclohexyl) peroxydicarbonate, di-2-ethylhexyl peroxydicarbonate, etc., may be mentioned, and as such a chain transfer agent, acetic acid, acetic anhydride, methyl acetate, ethylene glycol, propylene glycol, etc. may be mentioned.

As the solvent to be used in solution polymerization, a perfluorocarbon, a hydrofluorocarbon, a chlorohydrofluorocarbon, a hydrofluoroether, etc. may be mentioned.

The number of carbon atoms in these solvents is preferably from 4 to 12.

Specific examples of the perfluorocarbon include perfluorocyclobutane, perfluoropentane, perfluorohexane, perfluorocyclopentane, a perfluorocyclohexane, etc.

Specific examples of the hydrofluorocarbon include 1-hydroperfluorohexane, etc.

Specific examples of the chlorohydrofluorocarbon include 1,3-dichloro-1,1,2,2,3-pentafluoropropane, etc.

Specific examples of the hydrofluoroether include methyl perfluorobutyl ether, 2,2,2-trifluoroethyl 2,2,1,1-tetrafluoroethyl ether, etc.

The polymerization conditions are not particularly limited. The polymerization temperature is preferably from 0 to 100° C., more preferably from 20 to 90° C. The polymerization pressure is preferably from 0.1 to 10 MPa, more preferably from 0.5 to 3 MPa. The polymerization time is preferably from 1 to 30 hours.

In the case of using the monomer (m11) as the monomer (m1), the concentration of the monomer (m11) during the polymerization is preferably from 0.01 to 5 mol %, more preferably from 0.1 to 3 mol %, most preferably from 0.1 to 2 mol %, based on the total of all monomers. When the concentration of the monomer (m11) is within the above range, the polymerization rate during production will be proper. If the concentration of the monomer (m11) is too high, the polymerization rate tends to decrease.

During the polymerization, as the monomer (m11) is consumed by the polymerization, it is preferred that the amount consumed is supplied continuously or intermittently into the polymerization reactor, so as to maintain the concentration of the monomer within the above range.

Here, the method for producing the fluorocopolymer (X1) is not limited to the above method (α). For example, there may be mentioned (β) a method in which a fluorocopolymer having a unit (hereinafter referred to also as "unit (1A)") containing a functional group (hereinafter referred to also as "functional group (ii)") to form a functional group (i) by thermal decomposition, and the unit (2), is heated to thermally decompose the functional group (ii) in the unit (1A) to form the functional group (i) (e.g. a carboxy group), thereby to convert the unit (1A) to the unit (1), to obtain a fluorocopolymer (X1), or (γ) a method in which a monomer having a functional group (i) is graft-polymerized to a fluorocopolymer having the unit (2), to obtain a fluorocopolymer (X1).

[Other Resin (X2)]

The resin (X2) is another resin other than the fluorocopolymer (X1).

The resin (X2) is not particularly limited so long as it does not impair the characteristics of electrical reliability, but, it may, for example, be a fluoocopolymer other than the fluorocopolymer (X1), an aromatic polyester, a polyamideimide, a thermoplastic polyimide, etc.

The fluorocopolymer other than the fluorocopolymer (X1) may, for example, be polytetrafluoroethylene, a tetrafluoroethylene/perfluoroalkyl vinyl ether copolymer (but excluding the fluorocopolymer (X1)), a tetrafluoroethylene/hexafluoropropylene copolymer (but excluding the fluorocopolymer (X1)), an ethylene/tetrafluoroethylene copolymer, etc. One of these may be used alone, or two or more of them may be used in combination.

As the resin (X2), from the viewpoint of electrical reliability, a fluorocopolymer other than the fluorocopolymer (X1) is preferred.

As the fluorocopolymer other than the fluorocopolymer (X1), one having a melting point of at least 280° C. is preferred. When the melting point is at least 280° C., even if a molded product made of the composite as described later is exposed to a high temperature atmosphere corresponding to solder reflow, swelling (foaming) due to heat tends to be less likely to occur.

<Resin Particles (A)>

Resin particles (A) are made of the above-mentioned material (X).

The average particle size of the resin particles (A) is at least 100 μm, preferably from 100 to 10,000 μm, particularly preferably from 100 to 50,000 μm. When the average particle size is at least the above lower limit value, operation efficiency will be good. When the average particle size is at most the upper limit value in the above-mentioned preferred range, a load in the pulverization step will be small.

The average particle size of the resin particles (A) is obtained by e.g. a sieving method.

As the resin particles (A), if desired resin particles are commercially available, such commercial products may be used, or those produced by an appropriate method may be used.

The method for producing the resin particles (A) may, for example, be (1) a method in which the production of the fluorocopolymer (X1) by the above method (α) is carried out by solution polymerization, suspension polymerization or emulsion polymerization, and after the polymerization, the medium (organic solvent or aqueous medium) is removed to recover the granular fluorocopolymer (X1), and, as the case requires, the obtained granular fluorocopolymer (X1) is classified (sieved, etc.), or (2) a method in which a fluorocopolymer (X1) is alone, or at least two resin components containing a fluorocopolymer (X1) (i.e. at least two fluorocopolymers (X1), or at least one fluorocopolymer (X1) and at least one resin (X2)) are melt-kneaded, and the obtained kneaded product is pulverized, and, as the case requires, the obtained pulverized product is classified (sieved, etc.).

<Pulverization Step>

In the pulverization step, mechanical pulverization treatment is applied to the resin particles (A) to obtain a pulverized product.

The "mechanical pulverization treatment" means pulverization by means of an apparatus capable of exerting sufficient shear force and/or crush force to break material to be pulverized (resin particles (A), etc.), to smaller pieces.

Such an apparatus may, for example, be a hammer mill including a disintegrator, a pin mill, a disk mill, a rotary mill, a jet mill, a fluidized bed air jet mill, a jaw crusher, a gyratory crusher, a cage mill, a pan crusher, a ball mill, a pebble mill, a rod mill, a tube mills, a disc attrition mill, an attritor, a disk refiner, etc.

In a preferred embodiment, the mechanical pulverization treatment is a treatment carried out by using a hammer mill, a pin mill, a disk mill, a rotary mill or a jet mill. By using such an apparatus, it is easy to reduce the average particle size of the pulverized product.

In another preferred embodiment, the mechanical pulverization treatment is a treatment that is conducted after cooling the resin particles (A) to a temperature of at most −40° C. (hereinafter referred to also as "low-temperature pulverization treatment"). In the low-temperature pulverization treatment, low-temperature brittleness of the fluorocopolymer (X1) is utilized. By conducting pulverization after exposure to the low temperature of at most −40° C., it becomes easy to reduce the average particle size of the pulverized product, as compared with a case where the resin particles (A) are not cooled.

The cooling temperature in the low-temperature pulverization treatment is preferably at most −100° C., more preferably at most −160° C.

In the low-temperature pulverization treatment, it is preferred to conduct the pulverization after cooling in an atmosphere at a temperature of at most −40° C., particularly preferably at most −100° C. Thereby, it tends to be possible to further reduce the average particle size.

The cooling can be carried out, for example, by using solidified carbon dioxide or liquid nitrogen.

The apparatus to be used for pulverization by the low-temperature pulverization treatment may optionally be selected from among the above-mentioned various apparatus, but from such a viewpoint that it will be thereby easier to reduce the average particle size of the pulverized product, a hammer mill, a pin mill, a disk mill, a rotary mill or a jet mill is preferred.

The mechanical pulverization treatment is particularly preferably a low-temperature pulverization treatment, or a treatment conducted by means of a jet mill.

The pulverized product obtainable in the pulverization step, may be used as it is, as a resin powder (B), if the average particle diameter is from 0.02 to 50 μm. As the case requires, it may be subjected to the following classification step.

<Classification Step>

In the classification step, a pulverized product obtained in the pulverization step is classified to obtain a resin powder (B).

Classification is typically a treatment to remove either one or both of too large particles and too small particles.

The classification method may, for example, be a method by sieving, wind power classification, etc. For example, sieving of the pulverized product may be conducted by means of a sieve having any optional sieve size, and the sieved product passed through the sieve may be used as a resin powder (B).

The classification step may be conducted continuously from the pulverization step, for example, by using an apparatus equipped with a classifier as the apparatus to be used for mechanical pulverization treatment.

<Resin Powder (B)>

The resin powder (B) is one obtainable by applying a mechanical pulverization treatment to the resin particles (A), and, as the case requires, classifying the pulverized product.

Therefore, the resin powder (B) contains, like the resin particles (A), the fluorocopolymer (X1) as the main component.

The average particle size of the resin powder (B) is from 0.02 to 50 μm, preferably from 0.02 to 35 μm, more preferably from 0.02 to 25 μm, particularly preferably from 0.02 to 10 μm.

In a case where the resin powder (B) is to be made into a composite as described later, as the average particle size of the resin powder (B) is small, it is possible to increase the filling rate of the resin powder (B) in the resin (C). The higher the filling rate, the better the electrical properties of the composite (low relative dielectric constant, etc.). Further, as the average particle size of the resin powder (B) is small, it is possible to reduce the thickness of the molded product made of the composite.

When the average particle size of the resin powder (B) is at most the upper limit value in the above range, a sufficiently high filling rate can be attained. Further, the thickness of the molded product can be made thin, for example, to be thin useful for application to a flexible printed circuit board.

The average particle size of the resin powder (B) is a volume-based cumulative 50% diameter (D50) obtainable by a laser diffraction scattering method. That is, the particle size distribution is measured by a laser diffraction scattering method, and a cumulative curve is obtained by setting the total volume of the group of particles as 100%, whereby a particle diameter at a point where the cumulative volume on the cumulative curve becomes 50% is taken as the average particle size.

In a case where the average particle size of the resin powder (B) is more than 10 μm and at most 50 μm, the loosely packed bulk density of the resin powder (B) is preferably at least 0.18 g/mL, more preferably from 0.18 to 0.85 g/mL, particularly preferably from 0.2 to 0.85 g/mL. In a case where the average particle size of the resin powder (B) is from 0.02 to 10 μm, the loosely packed bulk density of the resin powder (B) is preferably at least 0.05 g/mL, more preferably from 0.05 to 0.5 g/mL, particularly preferably from 0.08 to 0.5 g/mL.

In a case where the average particle size of the resin powder (B) is more than 10 μm and at most 50 μm, the densely packed bulk density of the resin powder (B) is preferably at least 0.25 g/mL, more preferably from 0.25 to 0.95 g/mL, particularly preferably from 0.4 to 0.95 g/mL. In a case where the average particle size of the resin powder (B) is from 0.02 to 10 μm, the densely packed bulk density of the resin powder (B) is preferably at least 0.05 g/mL, more preferably from 0.05 to 0.8 g/mL, particularly preferably from 0.1 to 0.8 g/mL.

The larger the loosely packed bulk density or the densely packed bulk density, the better the handling efficiency of the resin powder (B). Further, it is possible to increase the filling rate of the resin powder (B) to the resin (C). On the other hand, when the loosely packed bulk density or the densely packed bulk density is at most the upper limit value in the above range, it can be used in a versatile process.

The loosely packed bulk density and the densely packed bulk density of the resin powder (B) are measured by the methods as described in Examples.

From the viewpoint of preparation of a thin film molded product having a thickness of at most 50 μm, the resin powder (B) preferably has an average particle size of from 0.02 to 6 μm and D90 of at most 8 μm, and more preferably has an average particle size of from 0.02 to 5 μm and D90 of at most 6 μm.

D90 of the resin powder (B) is a volume-based cumulative 90% diameter obtainable by a laser diffraction scattering method. That is, the particle size distribution is measured by a laser diffraction scattering method, and a cumulative curve is obtained by setting the total volume of the group of particles as 100%, whereby a particle diameter at a point where the cumulative volume becomes 90% on the cumulative curve is taken as D90.

The resin powder (B) is used preferably in the production of a composite, in the production of a ceramic molded product, or in the production of a prepreg, as described later.

Advantageous Effects

In the method for producing a resin powder of the present invention, at the time of obtaining a resin powder (B) having an average particle size of from 0.02 to 50 µm by applying a mechanical pulverization treatment to resin particles (A) having an average particle size of at least 100 µm, ones made of material (X) containing a fluorocopolymer (X1) as a main component are used as the resin particles (A), whereby it is possible to obtain a resin powder (B) having a large bulk density, as compared with a case where the same mechanical pulverization treatment is applied to resin particles containing a fluorocopolymer having a melting point of from 260 to 320° C. other than the fluorocopolymer (X1). Such a resin powder (B) is good in handling efficiency.

Further, the resin powder (B) tends to have a smaller average particle size, as compared with the resin powder obtainable by applying the same mechanical pulverization treatment to the resin particles containing a fluorocopolymer having a melting point of from 260 to 320° C. as a main component other than the fluorocopolymer (X1). As the average particle size is smaller, it is possible to lower the relative dielectric constant of a composite by increasing the filling rate of the resin powder (B) in the composite having the resin powder (B) dispersed in the resin (C). Further, it is possible to reduce the thickness of a molded product made of the composite.

Further, the fluorocopolymer (X1) has a high heat resistance and is melt-moldable, and therefore, the resin powder (B) also has a high heat resistance and is melt-moldable.

Further, since the fluorocopolymer (X1) has a functional group (i), adhesion between the resin powder (B) and the resin (C), dispersibility of the resin powder (B) in the composite, interlayer adhesion of a laminate (such as a metal laminated plate) obtainable by laminating a molded product made of the composite and another material (such as a metal), etc., will be good.

For example, in a case where the resin (C) is a thermosetting resin, a curing heat is generated at the stage of forming the composite. Since the fluorocopolymer (X1) has a melt flowability, by the curing heat, the surface of the resin powder (B) dispersed in the thermosetting resin is likely to be melted and have a low viscosity, and tends to be reactive with the thermosetting resin, whereby it is considered to be easily well dispersed in the thermosetting resin.

Therefore, the resin powder (B) is well dispersed in a thermosetting resin composition containing the thermosetting resin, and thus is useful for an application to produce a prepreg having the thermosetting resin composition impregnated in a fiber substrate.

Further, in the case of the metal laminated plate, in a case where a powder of the fluorocopolymer having a melting point of from 260 to 320° C., has no functional group (i), if the filling rate in the resin (C) becomes high, the adhesion between the substrate made of the composite and the metal layer will decrease, but by having a functional group (i), even if the filling rate is made high, adhesion between the substrate and the metal layer tends to be less likely to be reduced. Particularly when the substrate and the metal layer are laminated at a temperature near the melting point or exceeding the melting point of the fluorocopolymer (X1), improvement in the interlayer adhesion can be expected, as compared with a case where the conventional PTFE powder is used.

Therefore, the resin powder (B) is useful for an application to a printed circuit board. In addition to the application to a printed circuit board, it is also useful for an application to a ceramic molded product. Further, it is applicable also to injection molding or extrusion molding where freedom in shaping is high.

«Composite»

The composite of the present invention is one having the resin powder (B) dispersed in a resin (C) (but excluding the fluorocopolymer (X1)).

As the case requires, the composite of the present invention may contain an additive (D) (but excluding the resin powder (B)) within a range not to impair the effects of the present invention.

The content of the resin powder (B) in the composite of the present invention is preferably from 5 to 500 parts by mass, more preferably from 10 to 400 parts by mass, particularly preferably from 20 to 300 parts by mass to 100 parts by mass of the resin (C). When the content of the resin powder (B) is at least the lower limit value in the above range, the composite will be excellent in electrical properties. When the content of the resin powder (B) is at most the upper limit value in the above range, the composite will be excellent in mechanical strength. However, the present invention is not limited to this, and such a content may be optionally set depending upon the application, desired properties, etc. of the composite.

<Resin (C)>

The resin (C) is not particularly limited so long as it is a resin other than the fluorocopolymer (X1), and it may, for example, be a thermoplastic resin, a thermosetting resin, a photosensitive resin, etc.

The resin (C) is preferably a non-fluorinated resin.

The thermoplastic resin may, for example, be polycarbonate, polyethylene terephthalate, polyethylene naphthalate, polybutylene terephthalate, polyarylate, polycaprolactone, a phenoxy resin, polysulfone, polyether sulfone, polyether ketone, polyether ether ketone, polyether imide (hereinafter referred to also as "PEI"), semi-aromatic polyamide, polyamide 6, polyamide 66, polyamide 11, polyamide 12, polyamide 610, polyphenylene oxide, polyphenylene sulfide, polytetrafluoroethylene, an acrylonitrile-styrene-butadiene copolymer (ABS), polymethyl methacrylate (PMMA), polypropylene, polyethylene, polybutadiene, a butadiene-styrene copolymer, an ethylene-propylene copolymer, an ethylene-propylene-diene rubber (EPDM), a styrene-butadiene block copolymer, a butadiene-acrylonitrile copolymer, acrylic rubber, a styrene-maleic anhydride copolymer, a styrene-phenylmaleimide copolymer, aromatic polyester, polyamide-imide (hereinafter referred to also as "PAI"), thermoplastic polyimide (hereinafter referred to also as "TPI"), etc. One of these thermoplastic resins may be used alone, or two or more of them may be used in combination.

Among the above-mentioned, a thermoplastic resin having a melting point of at least 280° C. is preferred. When the melting point is at least 280° C., at the time when a molded product made of the composite is exposed to an atmosphere corresponding to the solder reflow, there is a tendency that swelling (foaming) due to the heat can be suppressed.

The thermosetting resin may, for example, be polyimide, an epoxy resin, an acrylic resin, a phenolic resin, a polyester resin, a bismaleimide resin, a polyolefin resin, a polyphenylene ether resin, a fluororesin, etc.

The thermosetting resin is preferably polyimide, an epoxy resin, an acrylic resin, a bismaleimide resin or a polyphenylene ether resin. In a case where the resin (C) is such a thermosetting resin, such a material may be suitably used for a printed circuit board. One of these thermosetting resins may be used alone, or two or more of them may be used in combination.

As the thermosetting resin, at least one member selected from the group consisting of polyimides and epoxy resins is more preferred.

As the polyimides, aromatic polyimides may be mentioned as preferred examples. Among them, a wholly aromatic polyimide produced by condensation polymerization of an aromatic polycarboxylic acid dianhydride and an aromatic diamine is preferred.

A polyimide is usually obtained via a polyamic acid (polyimide precursor) by a reaction (polycondensation) of a polyvalent carboxylic acid dianhydride (or its derivative) and a diamine.

A polyimide, in particular, an aromatic polyimide, due to its rigid backbone structure, is insoluble in a solvent, etc. and has a infusible property. Therefore, first, by the reaction of a polyvalent carboxylic acid dianhydride and a diamine, a polyimide precursor (polyamic acid or polyamide acid) soluble in an organic solvent, is synthesized, and at the stage of this polyimide precursor, molding processing is carried out in various ways. And then, polyamic acid is subjected to a dehydration reaction by heating or by a chemical method for cyclization (imidization) to obtain a polyimide.

As specific examples of the aromatic polycarboxylic acid dianhydride, those described in [0055] of JP-A-2012-145676, etc. may be mentioned.

Further, non-aromatic polycarboxylic acid dianhydrides such as ethylene tetracarboxylic acid dianhydride and cyclopentane tetracarboxylic acid dianhydride, can also be used to be comparable to the aromatic ones.

One of them may be used alone, or two or more of them may be used in combination.

As specific examples of the aromatic diamine, those described in [0057] of JP-A-2012-145676, etc. may be mentioned. One of them may be used alone, or two or more of them may be used in combination.

The epoxy resin may, for example, be a cresol novolac type epoxy resin, a bisphenol A type epoxy resin, a bisphenol F type epoxy resin, a phenol novolak type epoxy resin, an alkylphenol novolac type epoxy resin, a biphenol F type epoxy resin, a naphthalene type epoxy resin, a dicyclopentadiene-type epoxy resin, an epoxidized condensate of a phenol with an aromatic aldehyde having a phenolic hydroxy group, triglycidyl isocyanurate, an alicyclic epoxy resin, etc. One of them may be used alone, or two or more of them may be used in combination.

Commercially available products of the epoxy resin may, for example, be Epikote 828 (manufactured by Shell Chemicals) of an epi-bis type compound based on bisphenol A, etc., alkyl-modified type EPICLON800, EPICLON4050, EPICLON1121N (manufactured by DIC Corporation), Show dyne (manufactured by Showa Denko K.K.), a glycidyl ester-based compound such as Araldite CY-183 (manufactured by Ciba-Geigy), novolac type of Epikote 154 (manufactured by Shell Chemicals), DEN431, DEN438 (manufactured by the Dow Chemical Company), cresol novolac type ECN1280, ECN1235 (manufactured by Ciba-Geigy), urethane-modified type EPU-6, EPU-10 (manufactured by ADEKA Co., Ltd.), etc.

The weight average molecular weight of the epoxy resin is preferably from 100 to 1,000,000, more preferably from 1,000 to 100,000. When the weight average molecular weight of the epoxy resin is within the above range, it is possible to more firmly adhere a molded product of the composite and a metal layer.

The weight average molecular weight of the epoxy resin can be measured by gel permeation chromatography (GPC).

The bismaleimide resin may, for example, be a resin composition having a bisphenol A type cyanic acid ester resin and a bismaleimide compound used in combination, as disclosed in e.g. JP-A-7-70315. Such a resin composition is referred to as a BT resin and has excellent properties in e.g. electrical properties, mechanical properties, chemical resistance, etc., whereby it is suitable for use as a sealing material for a semiconductor element. Recently, with respect to a bismaleimide resin, a study for reducing the thermal expansion coefficient of its cured product has been made, and, for example, the invention and its background technology as described in WO2013/008667 may be mentioned. Such a bismaleimide resin may also be used as the resin (C).

As the photosensitive resin, it is possible to use various photosensitive resins which are commonly used for resist materials, etc. For example, an acrylic resin, etc. may be mentioned. Further, it is also possible to use one obtained by imparting photosensitivity to the above-mentioned thermosetting resin. A specific example of the photosensitive resin obtained by imparting photosensitivity to the thermosetting resin, may be one having a methacrylic group or an acrylic group introduced by reacting the thermosetting group of a thermosetting resin (e.g. the epoxy group in an epoxy resin) with methacrylic acid or acrylic acid.

<Additive (D)>

The additive (D) is preferably an inorganic filler having a low relative dielectric constant or dielectric loss tangent. As such an inorganic filler, silica, clay, talc, calcium carbonate, mica, diatomaceous earth, alumina, zinc oxide, titanium oxide, calcium oxide, magnesium oxide, iron oxide, tin oxide, antimony oxide, calcium hydroxide, magnesium hydroxide, aluminum hydroxide, basic magnesium carbonate, magnesium carbonate, zinc carbonate, barium carbonate, dawsonite, hydrotalcite, calcium sulfate, barium sulfate, calcium silicate, montmorillonite, bentonite, activated clay, sepiolite, imogolite, sericite, glass fiber, glass beads, silica-based balloons, carbon black, carbon nanotubes, carbon nanohorn, graphite, carbon fibers, glass balloons, carbon burn, wood flour, zinc borate, etc. may be mentioned. One of such inorganic fillers may be used alone, or two or more of them may be used in combination.

The inorganic filler may be porous or non-porous. It is preferably porous in that the relative dielectric constant or dielectric loss tangent is thereby further low.

The inorganic filler may be one in which a surface treatment with a surface treatment agent such as a silane coupling agent or a titanate coupling agent has been applied in order to improve the dispersibility in the resin (C).

In a case where an inorganic filler is incorporated, the content of the inorganic filler in the composite is preferably from 0.1 to 100 parts by mass, more preferably from 0.1 to 60 parts by mass, to 100 parts by mass of the resin (C).

The relative dielectric constant of the composite of the present invention is preferably from 2.0 to 3.5, particularly preferably from 2.0 to 3.0. When the relative dielectric constant is at most the upper limit value in the above range, the composite is useful for an application where a low relative dielectric constant is required, such as an application to a printed circuit board. When the relative dielectric constant is at least the lower limit value in the above range, both adhesion and electrical properties will be excellent.

The composite of the present invention can be produced by a conventional method.

In a case where the resin (C) is a thermoplastic resin, for example, a resin powder (B) and the thermoplastic resin may be blended, followed by melt kneading to obtain a composite.

In a case where the resin (C) is a thermosetting resin, for example, a resin powder (B) may be dispersed in a varnish of the thermosetting resin before thermal curing, followed by curing to produce a composite.

As applications of the composite of the present invention, an application for producing a metal laminated plate as described below, and an application for producing a printed circuit board as described below, are preferred. Further, the composite may be used to form at least one of an interlayer insulating film, a coverlay film and a solder resist for a printed circuit board.

An interlayer insulating film, a coverlay film and a solder resist using the composite of the present invention, may, respectively, be produced with reference to known methods, for example, methods described in JP-A-2013-21374, WO2014/188856, etc.

However, use of the composite of the present invention is not limited thereto, and it may be used for other purposes. For example, it is useful for electronics boards, such as radars, network routers, backplanes, wireless infrastructures, etc. for which high-frequency characteristics are required, substrates for various sensors for automobiles, substrates for engine management sensors, etc., and it is particularly useful for an application for the purpose of reducing a transmission loss of a millimeter wave band.

<Adhesive Film>

The adhesive film of the present invention is one in which a layer made of the composite of the present invention is laminated on at least one side of a heat-resistant resin film.

The layer made of the composite of the present invention may be laminated only on one side of the heat-resistant resin film, or may be laminated on both sides. With a view to suppressing warpage of the adhesive film or obtaining a double-sided metal laminate having excellent electrical reliability, it is preferred that the layer made of the composite of the present invention is laminated on both sides of the heat-resistant resin film.

In a case where the layer made of the composite of the present invention is laminated on both sides of the heat-resistant resin film, the composition and thickness of each layer made of the composite of the present invention may be the same or different. With a view to suppressing warpage of the adhesive film, it is preferred that the composition and thickness made of each layer of the composite of the present invention are the same.

<Heat-Resistant Resin Film>

The heat-resistant resin film is a film comprising one or more heat-resistant resins, and may be a single layered film or a multilayered film. However, the heat-resistant resin film contains no fluoropolymer.

In the present specification, the heat-resistant resin means a polymeric compound having a melting point of at least 280° C., or a polymeric compound having a highest continuous use temperature of at least 121° C. as defined in JIS C 4003: 2010 (IEC 60085 2007).

As the heat-resistant resin, for example, polyimide (aromatic polyimide, etc.), polyarylate, polysulfone, polyallyl sulfone (polyethersulfone, etc.), aromatic polyamide, aromatic polyether amide, polyphenylene sulfide, polyaryl ether ketone, polyamide-imide, liquid crystal polyester, etc. may be mentioned.

The heat-resistant resin film may be produced, for example, by a method of molding a heat resistant resin or a resin composition containing a heat resistant resin into a film-form by a known molding method (casting, extrusion molding, inflation molding, etc.). As the heat-resistant resin film, a commercial product may be used.

The surface of the heat-resistant resin film, for example, the surface to be laminated with a fluororesin layer, may be subjected to surface treatment. The method for such surface treatment is not particularly limited, and may suitably be selected for use from among known surface treatment methods such as corona discharge treatment, plasma treatment, etc.

As the heat-resistant resin film, a polyimide film is preferred. A polyimide film is a film composed of polyimide. The polyimide film may contain an additive, as the case requires, within a range not to impair the effects of the present invention.

«Molded Product»

The molded product of the present invention is made of the composite of the present invention.

The shape of the molded product is not particularly limited, and may, for example, be sheet-form (plate-form, film-form, etc.), three-dimensionally molded form, tubular, other extrudates, etc. In a case where the molded product is to be used for an application to a metal laminated plate or a printed circuit board, a sheet-form is preferred.

The thickness of the sheet-form molded product is preferably from 1 to 3,000 µm. In the case of the application to an electronic substrate, the thickness is preferably from 3 to 2,000 µm, more preferably from 5 to 1,000 µm, particularly preferably from 6 to 500 µm.

The molded product of the present invention can be produced by the same method as the above-mentioned method for producing the composite. As the case requires, the composite thus obtained may be processed by cutting, grinding, etc. to obtain a molded product of the present invention.

As the application of the molded product of the present invention, a metal laminated plate or a printed circuit board as described below, is preferred. However, the application of the molded product of the present invention is not limited thereto, and may be used for other purposes.

For example, it is also possible to constitute a coated article. Since the fluorocopolymer (X1) is excellent in corrosion resistance, a composite in which a resin powder (B) containing it as the main component is dispersed, also has an improved corrosion resistance as compared with a case where no resin powder (B) is contained. Therefore, it is possible to suitably use it in all areas where corrosion resistance is required.

The coated article is not particularly limited, and it is useful for an application utilizing non-tackiness, heat resistance, sliding properties, etc. of the fluorocopolymer. For example, as ones utilizing the non-tackiness, cooking utensils such as a frying pan, a pressure cooker, a pan, a grill pan, a cooking kettle, an oven, a hot plate, a bread type, a knife, a gas table, etc.; kitchen utensils such as an electric kettle, an ice tray, a mold, a range hood, etc.; food industrial parts such as a kneading roll, a rolling roll, a conveyor, a hopper, etc.; industrial supplies such as a roll for office automation (OA), a belt for OA, a separating nail for OA, a paper roll, a calender roll for film production, etc.; a mold for molding a foamed styrol, a casting mold, a mold release for a release plate for production of plywood, veneer, etc.; industrial containers (particularly for the semiconductor industry); etc. may be mentioned. As ones utilizing the sliding properties, tools such as a saw, a file, etc.; household products such as an iron, scissors, a kitchen knife, etc.; a metal foil, a wire, food processing machines, packaging machine, slide bearing for textile machinery; sliding parts for cameras and clocks; automobile parts, such as pipes, valves, bearings, etc.; a shoveling snow shovel, a plow, a chute, a coil wire for a motor, sealing material for electrical and electronical components, an exhaust duct, a plating jig, a basket for a centrifugal separator; etc. may be mentioned.

«Method for Producing Ceramic Molded Product»

The method for producing a ceramic molded product of the present invention comprises a step of mixing the resin powder (B) and the ceramic powder to obtain a mixture (hereinafter referred to also as "mixing step"), and a step of molding the mixture to obtain a ceramic molded product (hereinafter referred to also as "molding step").

The material for the ceramic powder may, for example, be forsterite type ceramics, alumina type ceramics, calcium titanate type ceramics, magnesium titanate type ceramics, strontium titanate type ceramics, zirconia-lead-titanium type ceramics, zirconia-tin-titanium type ceramics, barium titanate type ceramics, lead-calcium-zirconia type ceramics, lead-calcium-iron-niobium type ceramics, lead-calcium-magnesium-niobium type ceramics, etc.

The ceramic powder may be one surface-treated by a surface treatment agent (titanate type, aluminum type, silane type, etc.).

In the mixing step, as the case requires, another component other than the resin powder (B) and the ceramic powder, may be further mixed. As such another component, it is possible to use one known as an additive to a ceramic molded product.

In the mixing step, mixing of the resin powder (B) and the ceramic powder (and another component, as the case requires) may be carried out by a conventional method. For example, a method of blending the resin powder (B) and the ceramic powder uniformly in a solid phase state may be mentioned.

The content of the resin powder (B) in the mixture obtained in the mixing step is preferably from 5 to 500 parts by mass, more preferably from 20 to 200 parts by mass, to 100 parts by mass of the ceramic powder.

The molding step may be carried out by a known molding method commonly used for the production of ceramic molded products. For example, a method of melt molding (extrusion molding, press molding, injection molding, etc.) a kneaded product obtained by melt-kneading the mixture, may be mentioned.

Applications of the obtainable ceramic molded products may, for example, be antenna components, etc. Particularly preferred are antenna substrates.

«Metal Laminated Plate»

The metal laminated plate of the present invention comprises a substrate and a metal layer laminated on one side or both sides of the substrate.

The substrate is the above-described molded product of the present invention. Further, like the above-mentioned adhesive film, it may be a laminate of a heat-resistant resin film and a layer made of the composite of the present invention. Or, the substrate may be one obtained by applying the composite of the present invention.

The preferred range of the thickness of the substrate is the same as the preferred range of the thickness of the sheet-form molded product.

Here, the structure of the metal laminated plate of the present invention may, for example, be "a layer made of a composite of the present invention/a metal layer", "a metal layer/a layer made of a composite of the present invention/a metal layer", "a layer made of a heat-resistant resin film/a layer made of a composite of the present invention/a metal layer", "a layer made of a composite of the present invention/a layer made of a heat-resistant resin film/a metal layer", etc. Further, these layers may be combined with a layer made of a fluoropolymer (X1) to form structures of "a metal layer/a layer made of a composite of the present invention/a layer made of a heat-resistant resin film/a layer made of a fluoropolymer (X1)/a layer made of a heat-resistant resin film/a layer made of a composite of the present invention/a metal layer", "a metal layer/a layer made of a heat resistant resin film/a layer of a composite of the present invention/a layer of a fluorocopolymer (X1)/a layer of a composite of the present invention/a layer made of a heat-resistant resin film/a metal layer", "a metal layer/a layer made of a composite of the present invention/a layer made of a heat resistant resin film/a layer made of a composite of the present invention/a layer made of a fluorocopolymer (X1)/a layer made of a composite of the present invention/al layer made of a heat-resistant resin film/a layer made of a composite of the present invention/a metal layer", etc.

The metal constituting the metal layer is not particularly limited, and it may be suitably set depending on the application. For example, in a case where the metal laminated plate of the present invention is to be used for electronic devices and electrical equipment applications, the metal may, for example, be copper or a copper alloy, stainless steel or an alloy thereof, nickel or a nickel alloy (including 42 alloy), aluminum or an aluminum alloy, etc.

The thickness of the metal layer is not particularly limited, and it is preferably selected to be a thickness capable of providing a sufficient function depending on the use of the metal laminated plate.

The method for producing the laminated plate of the present invention may, for example, be a method of laminating a metal foil and a substrate, or a method of vapor depositing a metal on the surface of a substrate.

Lamination between the metal foil and the substrate may be carried out, for example, by a casting method or a heat lamination method.

The method for vapor depositing a metal may be carried out, for example by a vacuum deposition method, a sputtering method or an ion plating method.

As the metal foil, a commercial product may be used. For example, in a typical metal laminated plate in application to electronic equipment and electric equipment, a copper foil such as a rolled copper foil or an electrolytic copper foil is often used and can be preferably used also in the present invention.

On the surface of the metal foil, an anticorrosive layer (e.g. an oxide film such as a chromate) or a heat-resistant layer may be formed. Further, in order to improve the adhesion to the substrate, a coupling agent treatment or the like, may be applied to the surface of the metal foil.

«Printed Circuit Board»

The printed circuit board of the present invention comprises a patterned circuit formed by etching the metal layer of the metal laminated plate of the present invention. That is, it is one comprising a substrate being a molded product of the present invention, and a patterned circuit made of a metal laminated on one side or both sides of the substrate.

In the printed circuit board of the present invention, on the patterned circuit, an interlayer insulating film and a patterned circuit made of a metal, may be sequentially laminated. The interlayer insulating film may be one formed by using a composite of the present invention.

In the printed circuit board of the present invention, on the patterned circuit, a solder resist may be laminated. The solder resist may be one formed by using a composite of the present invention.

On the printed circuit board of the present invention, a coverlay film may be laminated. The coverlay film is typically composed of a substrate film and an adhesive layer formed on its surface, and the adhesive layer side surface is bonded to the printed circuit board. The coverlay film may be one formed by using a composite of the present invention. For example, the substrate film may be a molded product formed by using a composite of the present invention.

Further, the printed circuit board of the present invention may be one in which, on the patterned circuit, a composite of the present invention is used as an interlayer insulating film (adhesive layer), and a polyimide film is laminated as a coverlay film.

The composite of the present invention is useful as an interlayer insulating film, for example, as one for forming build-up insulating layers of a multilayer printed circuit board, as described in WO2009/035014.

«Prepreg»

The prepreg of the present invention is one obtained by impregnating at least one selected from a thermosetting resin composition containing the resin powder of the present invention and a thermoplastic resin composition comprising the resin powder of the present invention, in a fiber substrate.

The thermosetting resin composition contains a thermosetting resin, and the thermosetting resin may be one described in the above resin (C). As the thermosetting resin, an epoxy resin is preferred.

The thermoplastic resin composition contains a thermoplastic resin, and the thermoplastic resin may be one described in the above resin (C). As the thermoplastic resin, preferred is polyamide 6, polyamide 12, polyphenylene sulfide, polyetherimide, polyethersulfone, a polyaryl ketone (such as PEEK), an aromatic polyester, polyamide-imide, thermoplastic polyimide, etc.

The thermosetting resin composition may contain other components such as acrylic rubbers, in addition to the thermosetting resin and the resin powder of the present invention, as the case requires. The same applies to the thermoplastic resin composition.

As the fiber substrate, glass fiber, aramid fiber, carbon fiber, etc. may be mentioned.

The prepreg of the present invention can be prepared by a known production method except that, as a thermosetting resin composition to be impregnated in the fiber substrate, one containing the resin powder of the present invention is used. As methods for producing prepregs, for example, methods described in e.g. JP-A-2003-171480, JP-A-2007-138152, WO2014/050034, etc. may be mentioned. For example, a prepreg may be obtained by impregnating a thermosetting resin composition in a fiber substrate, and, as the case requires, followed by heating and drying until a semi-cured state is obtained.

The prepreg of the present invention may be laminated and molded with a metal foil to form a metal foil-laminated plate. This metal foil-laminated plate is also included in the metal laminated plate of the present invention.

Further, by etching the metal foil (metal layer) of the metal foil-laminated plate, it is possible to obtain a printed circuit board. This printed circuit board is also included in the printed circuit board of the present invention.

Such a metal foil-laminated plate, a printed circuit board, etc. may be produced with reference to, for example, JP-A-2003-171480, JP-A-2007-138152, WO2014/050034, etc.

The prepreg of the present invention may also be used in applications other than the application to electronic components. For example, it may be used as a material for a sheet pile required to have durability and light weight, to be used for quay construction, as described in e.g. JP-A-2007-239255.

Further, the prepreg of the present invention may be used as a material for a fiber reinforced plastic (FRP) made of reinforcing fibers and a matrix resin. FRP, in particular, a carbon fiber reinforced plastic (CFRP) using carbon fibers as the reinforcing fibers (fiber substrate), is excellent in mechanical properties, light weight, corrosion resistance, etc. as described in e.g. the background art of WO2013/175581, and thus is widely used as a material for producing members intended for a variety of applications including e.g. aircrafts, automobiles, ships, wind turbines, sport tools, etc.

EXAMPLES

Hereinafter, the present invention will be described in detail with reference to Examples. However, the present invention is not limited by the following description.

Measurement methods for fluorocopolymers and resin particles, as well as the resin particles used, will be described below.

(1) Copolymerized Composition

In the copolymerized composition of a fluorocopolymer, the proportion (mol %) of the unit based on NAH was obtained by the following infrared absorption spectrum analysis. The proportions of other units were obtained by the melt NMR analysis and fluorine content analysis.

"Proportion (Mol %) of the Unit Based on NAH"

A fluorocopolymer was press-molded to obtain a film of 200 μm. In the infrared absorption spectrum, the absorption peak of the unit based on NAH in a fluorocopolymer, appears at 1,778 $cm^{-1}$ in each case. By measuring the absorbance of the absorption peak, and using the molar extinction coefficient of NAH being 20,810 $mol^{-1} \cdot 1 \cdot cm^{-1}$, the proportion of the unit based on NAH in the fluorocopolymer was obtained.

(2) Melting Point (° C.)

Using a differential scanning calorimeter (DSC apparatus) manufactured by Seiko Electronics Co., Ltd., the melting peak at the time of heating a fluorocopolymer at a rate of 10° C./min was recorded, and the temperature (° C.) corresponding to the maximum value was adopted as the melting point (Tm).

(3) Mfr (g/10 Min)

Using the melt indexer manufactured by Technol Seven Co., Ltd., the mass (g) of a fluorocopolymer flowing out from a nozzle with a diameter of 2 mm and a length of 8 mm in 10 minutes (unit time) at 372° C. under a load of 49N, was measured.

(4) Relative Dielectric Constant

By the transformer bridge method in accordance with ASTM D 150 in such a test environment that the temperature was held within a range of 23° C.±2° C. and the relative humidity was held within a range of 50%±5% RH, by means of a breakdown test device (YSY-243-100RHO (manufactured by YAMAYOSHIKENKI)), a value obtained at 1 MHz was adopted as the relative dielectric constant.

(5) Loosely Packed Bulk Density and Densely Packed Bulk Density

The loosely packed bulk density and densely packed bulk density of the resin particles were measured by using a sample container with a volume of 100 mL by means of the A.B.D powder characteristics measuring device (ABD-100 type) manufactured by TSUTSUI SCIENTIFIC INSTRUMENTS CO., LTD. Specifically, with respect to the loosely packed bulk density, the mass of the resin particles in the sample container was calculated from the mass of the sample container (sample container+resin particles) measured by the following method (6a) and the mass of the sample container which had been measured before supplying the resin particles, the density (g/mL) was calculated from the obtained value, and the value was adopted as a loosely packed bulk density. With respect to the densely packed bulk density, the density (g/mL) was calculated in the same manner as above, except that instead of the mass of the sample container measured by the method of (6a), the mass of the sample container measured by the following method (6(3) was used, and its value was adopted as the densely packed bulk density.

(6a): The resin particles were supplied in the sample container so that the sample container became full in 30 to 60 seconds, resin particles mounted beyond the upper end of the sample container were removed with a spatula for leveling, and resin particles attached around the sample container were wiped off, whereupon the mass of the sample container was measured by an electronic balance.

(6(3): The resin particles were supplied in the sample container so that the sample container became full in 30 to 60 seconds, after tapping 180 times, resin particles mounted beyond the upper end of the sample container were removed with a spatula for leveling, and resin particles attached around the sample container were wiped off, whereupon the mass of the sample container was measured by an electronic balance.

(6) Average Particle Size of Resin Particles (A)

A 2.000 mesh sieve (mesh opening 2.400 mm), a 1.410 mesh sieve (mesh opening 1.705 mm), a 1.000 mesh sieve (mesh 1.205 mm), a 0.710 mesh sieve (mesh opening 0.855 mm), a 0.500 mesh sieve (mesh opening 0.605 mm), a 0.250 mesh sieve (mesh opening 0.375 mm), a 0.149 mesh sieve (mesh opening 0.100 mm) and a receiving tray were stacked from the top in this order. A sample (resin particles (A)) was placed thereon and sieved by a shaker for 30 minutes. Thereafter, the mass of the sample remaining on each sieve was measured, and the cumulative transit mass for each eye opening value was represented in a graph, whereby a particle size at the time when the cumulative transit mass became 50% was adopted as the average particle size of the sample.

(7) Average Particle Size and D90 of Resin Powder (B)

Using a laser diffraction-scattering particle size distribution measuring apparatus (LA-920 meter) manufactured by HORIBA LTD., resin powder (B) was dispersed in isopropyl alcohol, and the particle size distribution was measured, whereupon the average particle size (μm) and D90 (μm) were calculated.

(8) Peel Strength of Copper Foil

In order to measure the peel strength between the substrate and the copper foil in a double-sided copper clad laminate, or the peel strength between the thermosetting modified polyimide layer and the copper foil in a single-sided copper-clad laminate, the double-sided copper-clad laminate or the single-sided copper-clad laminate was cut in a size of a length 100 mm and a width 10 mm, to prepare a test specimen. The copper foil and the substrate were peeled from one end in the longitudinal direction of the test specimen to a position of 50 mm. Then, by setting the position of 50 mm from one end in the longitudinal direction of the test specimen at the center, 90 degree peeling was conducted at a rate of 50 mm/min by means of a tensile tester (manufactured by Orientec Co., Ltd.), whereby the maximum load was adopted as the peel strength (N/10 mm). The larger the peel strength, the better the adhesion between the substrate and the copper foil.

(9) Relative Dielectric Constant

With respect to a substrate exposed by removing a copper foil portion of a double-sided copper-clad laminate, the relative dielectric constant at a frequency of 2.5 GHz was obtained by the split post dielectric resonator method (SPDR method).

Equipments used in the relative dielectric constant measurement, were nominal fundamental frequency of 2.5 GHz type split post dielectric resonator manufactured by QWED Company., vector network analyzer E8361C manufactured by Keysite Technologies and 85071E option 300 relative dielectric constant calculation software manufactured by Keysite Technologies.

(Resin Particles (A-1))

A fluorocopolymer (X1-1) was produced in the following procedure by using NAH (anhydrous high-mix acid, manufactured by Hitachi Chemical Co., Ltd.) as a monomer to form the unit (1) and PPVE ($CF_2=CFO(CF_2)_3F$, manufactured by Asahi Glass Company, Limited) as a monomer to form the unit (3).

Firstly, 369 kg of 1,3-dichloro-1,1,2,2,3-pentafluoropropane (AK225cb, manufactured by Asahi Glass Company, Limited) (hereinafter referred to as "AK225cb") and 30 kg of PPVE were charged into a preliminarily degassed polymerization vessel having an internal volume of 430 L (liters) and equipped with a stirrer. Then, inside of the polymerization vessel was heated to raise the temperature to 50° C., and 50 kg of TFE was further charged, whereupon the pressure in the polymerization vessel was raised to 0.89 MPa/G. Here, "/G" indicates that the pressure is a gauge pressure.

Further, a polymerization initiator solution was prepared by dissolving (perfluoro butyryl) peroxide at a concentration of 0.36 mass % and PPVE at a concentration of 2 mass % in AK225cb, and 3 L of the polymerization initiator solution was continuously added at a rate of 6.25 mL per minute into the polymerization vessel, to carry out polymerization. Further, TFE was continuously charged in order to maintain the pressure in the polymerization vessel during the polymerization reaction to be 0.89 MPa/G. Further, a solution prepared by dissolving NAH at a concentration of 0.3 mass % in AK225cb was charged continuously by an amount corresponding to 0.1 mol % based on moles of TFE to be charged during the polymerization.

After 8 hours from the initiation of polymerization, when 32 kg of TFE was charged, the temperature in the polymerization vessel was lowered to room temperature, and the pressure was purged to atmospheric pressure. The obtained slurry was separated from AK225cb by solid-liquid separation and dried at 150° C. for 15 hours, to obtain 33 kg of a particulate fluorocopolymer (X1-1).

From the results of the melt NMR analysis and infrared absorption spectrum analysis, the copolymerized composition of the fluorocopolymer (X1-1) was found to be the unit based on NAH/the unit based on TFE/the unit based on PPVE=0.1/97.9/2.0 (mol %). Further, this fluorocopolymer (X1-1) had a melting point of 300° C., a dielectric constant of 2.1 and MFR of 17.6 g/10 min.

Further, the average particle size of the fluorocopolymer (X1-1) was 1,554 μm. This fluorocopolymer (X1-1) was used as the resin particles (A-1).

(Resin Particles (A-2))

As the resin particles (A-2), commercially available granular PFA (product name "Fluon (registered trademark) PFA 63P", manufactured by Asahi Glass Company, Limited) was used.

PFA constituting the resin particles (A-2) is one containing no functional group (i), and the melting point was 300° C., the dielectric constant was 2.1, and MFR was 12.8 g/10 min.

<Production of Resin Powder>

Example 1

Using a rotor mill (Rotor speed mill P-14, manufactured by Fritsch), the resin particles (A-1) were pulverized at a rotational speed of 1,300 rpm. The obtained pulverized material was sieved, and one passed through a sieve size of 0.5 mm was recovered to obtain a resin powder (B-1).

The characteristics (average particle size, loosely packed bulk density and densely packed bulk density) of the resin powder (B-1) were measured. The results are shown below.
Average particle size: 22.08 μm.
Loosely packed bulk density: 0.513 g/mL.
Densely packed bulk density: 0.686 g/mL.

Comparative Example 1

A resin powder (B-2) was obtained in the same manner as in Example 1 except that the resin particles (A-2) were used instead of the resin particles (A-1).

The characteristics of the resin powder (B-2) were measured. The results are shown below.
Average particle size: 33.56 μm.
Loosely packed bulk density: 0.162 g/mL.
Densely packed bulk density: 0.205 g/mL.

Example 2

The resin particles (A-1) were cooled to −196° C. with liquid nitrogen, and then, using a hammer mill (Rin Rex Mill LX-0, manufactured by Hosokawa Micron Co., Ltd. and Liquid Gas Co., Ltd.), they were pulverized in an environment of −160° C. at a rotation speed of 80 m/s under a condition of a processing amount of 3 kg/hour, to obtain a resin powder (B-3).

The characteristics of the resin powder (B-3) were measured. The results are shown below.
Average particle size: 6.2 μm.
D90: 13.2 μm.
Loosely packed bulk density: 0.199 g/mL.
Densely packed bulk density: 0.243 g/mL.

Example 3

Using a jet mill (single track jet mill FS-4 type, manufactured by Seishin Enterprise Co., Ltd.), the resin particles (A-1) were pulverized under conditions of a pulverization pressure of 0.5 MPa and a treatment speed of 1 kg/hr to obtain a resin powder (B-4).

The characteristics of the resin powder (B-4) were measured. The results are shown below.
Average particle size: 2.58 μm.
D90: 7.1 μm.
Loosely packed bulk density: 0.278 g/mL.
Densely packed bulk density: 0.328 g/mL.

From the comparison between Example 1 and Comparative Example 1, it was confirmed that as PFA contains the functional group (i), the average particle size of the resin powder obtainable by conducting mechanical pulverization under the same pulverization conditions, becomes small and the bulk density (loosely packed bulk density and densely packed bulk density) becomes large.

From the results of Examples 2 and 3, it was confirmed that by carrying out mechanical pulverization of the resin particles (A-1) after cooling to at most −40° C., or by using a jet mill, a fine resin powder having an average particle size of at most 10 μm can be easily obtained.

Example 4

The resin powder (B-4) was classified under a condition of a treating amount of 0.5 kg/hr by means of a high efficiency precision air classifier (Classy Le N-01 type manufactured by Seishin Enterprise Co. Ltd.) in order to obtain a resin powder (B-5) having a particle size of at most 10 μm. The yield of the resin powder (B-5) obtained by the classification was 89.4%, the average particle size was 1.8 μm, and D90 was 4.6 μm.

Example 5

A resin powder (B-6) was obtained in the same manner as in Example 4 except that the resin powder (B-3) was used instead of the resin powder (B-4). The yield of the resin powder (B-6) was 65.1%, the average particle size was 2.9 μm, and D90 was 6.6 μm.

Example 6

In order to further reduce the average particle size of the resin powder (B-6), after conducting pulverization under the same conditions as in Example 2 again, the same operation as in Example 4 was conducted to obtain a resin powder (B-7). The average particle size was 2.0 μm, and D90 was 4.5 μm.

Comparative Example 2

Using a jet mill (single track jet mill FS-4 type, manufactured by Seishin Enterprise Co., Ltd.), the resin particles (A-2) were pulverized under conditions of a pulverization pressure of 0.5 MPa and a treating speed of 1 kg/hr, to obtain a resin powder (B-8).

The characteristics of the resin powder (B-8) were measured. The results are shown below.
Average particle size: 7.6 μm.

Comparative Example 3

The resin powder (B-8) was classified under a condition of a treating amount of 0.5 kg/hr by means of a high efficiency precision air classifier (Classy Le N-01 type, manufactured by Seishin Enterprise Co. Ltd.) in order to obtain a resin powder (B-9) having a particle size of at most 10 μm, whereby clogging occurred during the classification, and the yield of the resin powder (B-9) was only 41%. The average particle size of the resin powder (B-9) was 6.8 μm.

<Production of Copper-Clad Laminate>

Example 7

The resin powder (B-4) was added to a thermosetting modified polyimide varnish having an epoxy group (solvent: N-methylpyrrolidone (hereinafter referred to as "NMP", manufactured by PI R&D CO., LTD.), solid content: 15 mass %), to satisfy the thermosetting modified polyimide:resin powder (B-4)=75:25 (mass ratio), followed by stirring under a condition of 1,000 rpm with a stirrer for 1 hour. Then, vacuum degassing treatment was carried out for 2 hours to obtain a solution composition.

After the vacuum degassing treatment, in this solution composition, no aggregation of the resin powder was observed on appearance. This solution composition was subjected to a filtration with a 100 mesh filter, and it was possible to filter the solution composition with no aggregation at the filter portion.

Then, on an electrolytic copper foil having a thickness of 12 μm (CF-T4X-SVR-12, manufactured by Fukuda Metal Foil & Powder Co., Ltd., surface roughness (Rz) 1.2 μm), the solution composition filtered through the filter was applied and dried to form a substrate so that the thickness of the coating film (substrate) after drying under the following drying conditions would be 25 μm, to obtain a single-sided copper-clad laminate with a structure of copper foil/substrate.

Drying conditions: drying was carried out by heating in an oven at 90° C. for 5 minutes, then at 120° C. for 5 minutes, and finally at 150° C. for 5 minutes.

With respect to the obtained single-sided copper-clad laminate, the presence or absence of aggregates in the substrate was confirmed by visual observation, whereby aggregates were slightly observed.

Example 8

A solution composition was obtained in the same manner as in Example 7 except that the resin powder (B-5) was used instead of the resin powder (B-4).

After the vacuum degassing treatment, in this solution composition, no aggregation of the resin powder was observed on appearance. This solution composition was subjected to filtration with a 100 mesh filter, whereby it was possible to filter the solution composition with no aggregation at the filter portion.

By carrying out the same operation and drying as in Example 7, a single-sided copper-clad laminate with a structure of copper foil/substrate was obtained. With respect to the obtained single-sided copper-clad laminate, the presence or absence of aggregates in the substrate was visually confirmed, whereby no aggregates were observed.

Example 9

A solution composition was obtained in the same manner as in Example 7 except that the resin powder (B-6) was used instead of the resin powder (B-4).

After the vacuum degassing treatment, in this solution composition, no aggregation of the resin powder was observed on appearance. This solution composition was subjected to filtration with a 100 mesh filter, whereby it was possible to filter the solution composition with no aggregation at the filter portion.

By carrying out the same operation and drying as in Example 7, a single-sided copper-clad laminate with a structure of copper foil/substrate was obtained. With respect to the obtained single-sided copper-clad laminate, the presence or absence of aggregates in the substrate was visually confirmed, whereby aggregates were slightly observed.

Example 10

A solution composition was obtained in the same manner as in Example 7 except that the resin powder (B-7) was used instead of the resin powder (B-4).

After the vacuum degassing treatment, in this solution composition, no aggregation of the resin powder was observed on appearance. This solution composition was subjected to filtration with a 100 mesh filter, whereby it was possible to filter the solution composition with no aggregation at the filter portion.

By carrying out the same operation and drying as in Example 7, a single-sided copper-clad laminate with a structure of copper foil/substrate was obtained. With respect to the obtained single-sided copper-clad laminate, the presence or absence of aggregates in the substrate was visually confirmed, whereby aggregates were slightly observed.

Comparative Example 4

A solution composition was obtained in the same manner as in Example 7 except that the resin powder (B-8) was used instead of the resin powder (B-4).

After the vacuum degassing treatment, in this solution composition, aggregation of the resin powder was observed on appearance. This solution composition was subjected to filtration with a 100 mesh filter, whereby aggregates were observed at the filter portion, and filter clogging occurred, whereby it was not possible to reach the step of preparing a single-sided copper-clad laminate as in Examples 7 to 10.

Example 11

On the substrate surface of the single-sided copper-clad laminate prepared in Example 8, an electrolytic copper foil having a thickness of 12 μm (CF-T4X-SVR-12, manufactured by Fukuda Metal Foil & Powder Co., Ltd., surface roughness (Rz) 1.2 μm) was overlaid and vacuum-pressed under conditions of a temperature of 220° C. and 3 MPa for 60 minutes to obtain a double-sided copper-clad laminate.

With respect to the obtained double-sided copper-clad laminate, the peel strength between the single-sided copper-clad laminate and the copper foil overlaid on the substrate surface, and the relative dielectric constant of the substrate, were measured. The results are shown in Table 1.

Comparative Example 5

The thermosetting modified polyimide varnish having an epoxy group (solvent NMP, manufactured by PI R&D CO., LTD., solid content 15 mass %) was subjected to filtration with a 100 mesh filter to obtain a solution composition. The obtained solution composition was applied and dried, under the same conditions as in Example 7, on the same electrolytic copper foil as in Example 7, to obtain a single-sided copper clad laminate with a structure of copper foil/substrate.

Then, a double-sided copper clad laminate was obtained in the same manner as in Example 11 except that instead of the single-sided copper-clad laminate prepared in Example 8, the single-sided copper clad laminate obtained above, was used.

With respect to the obtained double-sided copper-clad laminate, the peel strength between the single-sided copper-clad laminate and the copper foil overlaid on the substrate surface, and the relative dielectric constant of the substrate, were measured. The results are shown in Table 1.

TABLE 1

|  | Example 11 | Comparative Example 5 |
| --- | --- | --- |
| Resin powder | (B-5) | — |
| Peel strength with copper foil (N/cm) | 14.7 | 12.2 |
| Relative dielectric constant | 2.85 | 3.05 |

Example 12

A solution composition was obtained in the same manner as in Example 7 except that the resin powder (B-5) was used instead of the resin powder (B-4).

After the vacuum degassing treatment, in this solution composition, no aggregation of the resin powder was observed on appearance, and this solution composition was subjected to filtration with a 100 mesh filter, whereby it was possible to filter the solution composition with no aggregation observed at the filter portion.

On a polyimide film having a thickness of 25 μm (product name "Kapton" (registered trademark) manufactured by DuPont-Toray Co., Ltd.), the solution composition filtered through the filter was applied and dried to form a coating film so that the thickness of the coating film (thermosetting modified polyimide layer) after drying under the following conditions would be 25 μm, to obtain a laminate with a structure of polyimide film/thermosetting modified polyimide layer.

Drying conditions: Drying was carried out by heating in an oven at 90° C. for 5 minutes, then at 120° C. for 5 minutes, and finally at 150° C. for 5 minutes. With respect to the obtained laminate, the presence or absence of aggregates in the thermosetting modified polyimide layer, was visually confirmed, whereby no aggregates were observed.

Example 13

On the thermosetting modified polyimide layer surface of the laminate prepared in Example 12, an electrolytic copper foil having a thickness of 12 μm (CF-T4X-SVR-12, manufactured by Fukuda Metal Foil & Powder Co. Ltd., surface roughness (Rz) 1.2 μm) was overlaid and vacuum-pressed under conditions of a temperature of 220° C. and 3 MPa for 60 minutes to obtain a single-sided copper-clad laminate.

With respect to the obtained single-sided copper-clad laminate, the peel strength between the thermosetting modified polyimide layer and the copper foil, was measured. The results are shown in Table 2.

Comparative Example 6

A laminate with a structure of polyimide film/thermosetting modified polyimide layer was obtained in the same manner as in Example 12 except that the resin powder (B-5) was not added.

A single-sided copper-clad laminate was obtained in the same manner as in Example 13 except that after carrying out drying under the same drying conditions as in Example 7, the laminate obtained above was used instead of the laminate prepared in Example 12.

With respect to the obtained single-sided copper-clad laminate, the peel strength between the thermosetting modified polyimide layer and the copper foil was measured. The results are shown in Table 2.

TABLE 2

|  | Example 13 | Comparative Example 6 |
| --- | --- | --- |
| Resin powder | (B-5) | — |
| Peel strength with copper foil (N/cm) | 13.8 | 12.4 |

Example 14

The fluorocopolymer (X1-1) was extrusion-molded at a die temperature of 340° C. by means of a 30 mmφ single screw extruder having a 750 mm width coat hanger die, to obtain a fluororesin film having a thickness of 50 μm (hereinafter referred to as "film 1"). The film 1 and a polyimide film having a thickness of 25 μm (product name "Kapton (registered trademark)", manufactured by Du Pont-Toray Co., Ltd.) were laminated in the order of polyimide film/film 1/polyimide film and vacuum-pressed at a temperature of 360° C. under a pressure of 3.7 MPa for 10 minutes, to obtain a "laminated film 1". Then, two sheets of the single-sided copper-clad laminate obtained in Example 8 and the laminated film 1, were vacuum-pressed in the order of single-sided copper clad laminate/laminated film 1/single-sided copper foil laminate under conditions of a temperature of 220° C. and 3 MPa for 60 minutes, to prepare a double-sided copper-clad laminate. Here, the surface of the single-sided copper-clad laminate to be bonded to the laminate film 1 was the surface of the coating film (substrate). With respect to the insulating layer (150 μm) other than the copper foil in this double-sided copper-clad laminate, the relative dielectric constant was measured and found to be 2.86.

Example 15

Two sheets of the single-sided copper-clad laminate obtained in Example 8 and the film 1 obtained in Example 14, were vacuum-pressed in the order of single-sided copper clad laminate/film 1/single-sided copper foil laminate under conditions of a temperature of 220° C. and 3 MPa for 60 minutes, to prepare a double-sided copper-clad laminate. Here, the surface of the single-sided copper-clad laminate to be bonded to the film 1 was the surface of the coating film (substrate). With respect to the insulating layer (100 μm) other than the copper foil in this double-sided copper-clad laminate, the relative dielectric constant was measured and found to be 2.47.

INDUSTRIAL APPLICABILITY

The composite, molded product, ceramic molded product, metal laminated plate, printed circuit board, prepreg, etc. to be formed by using the resin powder obtained by the present invention, can be used as antenna components, printed circuit boards, aircraft parts, automotive parts, sports equipment, food industrial products, saws, coated articles such as sliding bearings, etc.

This application is a continuation of PCT Application No. PCT/JP2015/071803, filed on Jul. 31, 2015, which is based upon and claims the benefit of priorities from Japanese Patent Application No. 2014-157574 filed on Aug. 1, 2014 and Japanese Patent Application No. 2015-058672 filed on Mar. 20, 2015. The contents of those applications are incorporated herein by reference in their entireties.

What is claimed is:

1. A resin powder having an average particle size of from 0.02 to 50 μm, consisting essentially of a fluorocopolymer having a melting point of from 260 to 320° C., said fluorocopolymer comprising a unit based on 5-norbornene-2,3-dicarboxylic acid anhydride, a unit based on tetrafluoroethylene and a unit based on $CF_2=CFO(CF_2)_3F$, wherein a proportion of the unit based on 5-norbornene-2,3-dicarboxylic acid anhydride to the total of all units constituting the fluorocopolymer is from 0.05 to 1 mol %, a proportion of the unit based on tetrafluoroethylene to the total of all units constituting the fluorocopolymer is from 96 to 98.95 mol %, and a proportion of the unit based on $CF_2=CFO(CF_2)_3F$ to the total of all units constituting the fluorocopolymer is from 1 to 9.95 mol %.

2. The resin powder according to claim 1, wherein the average particle size is from 0.02 to 10 μm, and a densely packed bulk density is from 0.05 to 0.8 g/ml.

3. The resin powder according to claim 1, wherein the average particle size is more than 10 μm and at most 50 μm, and a densely packed bulk density is from 0.25 to 0.95 g/ml.

4. The resin powder according to claim 1, which is used for forming a ceramic molded product, a metal laminated plate, a printed circuit board or a prepreg.

5. The resin powder according to claim 1, wherein the average particle size is from 0.02 to 35 μm.

6. The resin powder according to claim 1, wherein the average particle size is from 0.02 to 10 μm.

* * * * *